(12) United States Patent
Terashima

(10) Patent No.: US 6,878,998 B1
(45) Date of Patent: Apr. 12, 2005

(54) SEMICONDUCTOR DEVICE WITH REGION THAT CHANGES DEPTH ACROSS THE DIRECTION OF CURRENT FLOW

(75) Inventor: Tomohide Terashima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 88 days.

(21) Appl. No.: 09/661,035

(22) Filed: Sep. 13, 2000

(30) Foreign Application Priority Data

Apr. 13, 2000 (JP) ........................... 2000-112174

(51) Int. Cl.[7] .................. H01L 29/76; H01L 23/58; H01L 27/082
(52) U.S. Cl. .................. 257/343; 257/492; 257/493; 257/592
(58) Field of Search .................. 257/335, 343, 257/592, 492, 493

(56) References Cited

U.S. PATENT DOCUMENTS 5,432,370 A * 7/1995 Kitamura et al. ........... 257/343

FOREIGN PATENT DOCUMENTS

| JP | 61-207066 | * 9/1986 | ................. 257/592 |
| JP | 7-130996 | 5/1995 | |

OTHER PUBLICATIONS

"Semiconductor devices—Physics and Technology" by Sze, 1985, P, 70–83.*

* cited by examiner

Primary Examiner—Steven Loke
(74) Attorney, Agent, or Firm—McDermott Will & Emery LLP

(57) ABSTRACT

$N^+$-type diffusion regions, P-type diffusion region and others are formed at and near a surface of an $N^-$-type epitaxial layer on a p-type silicon substrate. Gate electrode portions are formed on P-type diffusion region located between $N^-$-type diffusion regions and $N^-$-type epitaxial layer with a gate insulating film therebetween. A source electrode and a drain electrode are formed. Under a field isolating film, a P-type diffusion region is formed discretely in a direction crossing a direction of a current flow in the on state. Thereby, such a semiconductor device is obtained that rising of an on resistance can be suppressed in an on state while keeping an effect of reducing an electric field.

16 Claims, 24 Drawing Sheets

US 6,878,998 B1

SEMICONDUCTOR DEVICE WITH REGION THAT CHANGES DEPTH ACROSS THE DIRECTION OF CURRENT FLOW

BACKGROUND OF THE INVENTION

1. Field of the Invention

The present invention relates to a semiconductor device, and particularly relates to a semiconductor device provided with Double Diffused Metal Oxide Semiconductor (which will be referred to as "DMOS" hereinafter) transistors and others.

2. Description of the Background Art

A semiconductor device provided with the DMOS transistors will be described below as an example of the semiconductor device for switching a large current. As shown in FIG. 31, an N$^-$-type epitaxial layer 102 is formed on a p-type silicon substrate 101. N$^+$-type diffusion regions 106a–106d are formed at and near the surface of N-type epitaxial layer 102. A P-type diffusion region 105a surrounding N$^+$-type diffusion regions 106a and 106b is formed at and near the surface of N$^-$-type epitaxial layer 102. Likewise, a P-type diffusion region 105b surrounding N$^+$-type diffusion regions 106c and 106d is formed.

A gate electrode portion 108a is formed on the surface of P-type diffusion region 105a, which is located between N$^+$-type diffusion region 106a and N$^-$-type epitaxial layer 102, with an insulating film therebetween. A gate electrode portion 108b is formed on the surface of P-type diffusion region 105b, which is located between N$^+$-type diffusion region 106c and N-type epitaxial layer 102, and the surface of P-type diffusion region 105a, which is located between N$^+$-type diffusion region 106b and N$^-$-type epitaxial layer 102, with an insulating film therebetween.

A source electrode portion 109 is electrically connected to N$^+$-type diffusion regions 106a–106d. A field isolating film 114 is formed at the surface of N$^-$-type epitaxial layer 102. A drain electrode 110 is formed on a side of field isolating film 114 remote from gate electrode portion 108a.

Drain electrode 110 is electrically connected to N$^+$-type diffusion layer 104 formed at N$^-$-type epitaxial layer 102. An N$^+$ embedded diffusion region 103 is formed between p-type silicon substrate 101 and N$^-$-type epitaxial layer 102. A p-type diffusion region 107 is formed under field insulating film 114.

An operation of the semiconductor device described above is as follows. By applying a predetermined potential to gate electrode portions 108a and 108b, channel regions are formed in P-type diffusion regions 105a and 105b, and a current flows from source electrode portion 109 through N$^+$-type diffusion regions 106a, 106b and 106c to drain electrode portion 110 as indicated by arrows.

In the above operation, as shown in FIG. 32, a depletion layer (depletion layer A) expands from the interfaces between N$^-$-type epitaxial layer 102 and P-type diffusion regions 105a and 105b toward N$^-$-type epitaxial layer 102. Likewise, a depletion layer 120 (depletion layer B) expands from the interface between P-type diffusion region 107 and N$^-$-type epitaxial layer 102 toward N$^-$-type epitaxial layer 102. In particular, depletion layer B suppresses concentration of an electric field, and durability is improved. The conventional semiconductor device provided with the DMOS transistors has the foregoing structure, and operates in the foregoing manner.

As described above, P-type diffusion region 107 is formed for the purpose of suppressing the concentration of the electric field by the depletion layer which extends from the interface between P-type diffusion region 107 and N—type epitaxial layer 102 toward the N$^-$-type epitaxial layer 102, and thereby improving the breakdown voltage. However, in the on state where a current flows from source electrode portion 109 toward drain electrode portion 110, such a problem occurs that P-type diffusion region 107 intercepts the current flow so that the on resistance rises.

FIG. 33A is a graph showing a result of evaluation of a relationship between the drain current and the drain voltage with various gate voltages of the DMOS transistor, which is not provided with P-type diffusion region 107. FIG. 33B is a graph showing a result of evaluation of the relationship between the drain current and the drain voltage in the DMOS transistor provided with P-type diffusion region 107.

As shown in FIGS. 33A and 33B, the drain current in the structure provided with P-type diffusion region 107 is lower than that in the structure not provided with P-type diffusion region 107 if the same drain voltages are used. In particular, when the drain voltage is relatively low, the drain current is likewise low.

Therefore, the structure provided with P-type diffusion region 107 suffers from such a problem that the on resistance in the on state is approximately three–five times larger than that in the structure not provided with P-type diffusion region 107.

SUMMARY OF THE INVENTION

The invention has been developed for overcoming the above problem, and it is an object of the invention to provide a semiconductor device which can suppress rising of an on resistance without reducing an effect of reducing an electric field in the on state.

A semiconductor device according to the invention includes a semiconductor substrate of a first conductivity type, a first region of a second conductivity type, a second region of a second conductivity type, a third region of a first conductivity type, a first electrode portion, a second electrode portion, a third electrode portion and a fourth region. The first region is formed on and in direct contact with the semiconductor substrate. The second region is formed at and near the surface of the first region. The third region is formed at and near the surface of the first region, and surrounds the second region. The first electrode portion is formed on the surface of the third region located between the first and second regions with an insulating film therebetween. The second electrode portion is connected to the second region. The third electrode portion is connected to the first region and is spaced by a distance from the third region. The fourth region is formed at and near the surface of the first region between the third electrode portion and the third region. The fourth region has a depth changing as a position moves in a direction crossing a direction of flow of the current.

The above structure provides a so-called MOS transistor which includes the first, second and third regions as well as the first electrode portion. By applying a predetermined voltage to the first electrode portion, the structure enters the on state where a current flows from the second electrode portion toward the third electrode portion through the second and first regions. In this state, a depletion layer extends from an interface between the first and fourth regions toward the first region. Since the depth of the fourth region changes as the position moves in the direction crossing the direction of the current flow, the position of the end of the depletion layer changes in accordance with the depth of the fourth region. Thereby, the current can flow through the first region near a position immediately under the end of the depletion layer, which is formed in the direction crossing the direction of the current flow, and is located in a shallower position. Thereby, such a situation is suppressed that flow of the current is prevented. This depletion layer reduces the electric field. As a result, rising of the on resistance can be suppressed while keeping the effect of reducing the electric field.

Preferably, a fifth region of the first conductivity type surrounding the third electrode portion is formed at and near the surface of the first region.

In this case, a bipolar transistor including the first, third and fifth regions is configured such that a current is supplied to the first region via the channel region formed in the third region when a predetermined voltage is applied to a first electrode, and thus a so-called insulated gate bipolar transistor is formed.

According to another aspect of the invention, a semiconductor device includes a semiconductor substrate of a first conductivity type, a first region of a second conductivity type, a second region of the second conductivity type, a third region of the first conductivity type, a first electrode portion, a second electrode portion, a third electrode portion and a fourth region of the first conductivity type. The first region is formed on and in direct contact with the semiconductor substrate. The second region is formed at and near the surface of the first region. The third region is formed at and near the surface of the first region, and surrounds the second region. The first electrode portion is connected to the third region. The second electrode portion is connected to the second region. The third electrode portion is spaced from the third region by a distance, and is connected to the first region. The fourth region is formed at and near the surface of the first region between the third electrode portion and the third region. The fourth region has a depth changing as a position moves in a direction crossing a direction of flow of the current.

This structure provides a so-called bipolar transistor including the first, second and third regions. By applying a predetermined voltage to the first electrode portion connected to the third region, the structure enters an on state where the current flows from the second electrode portion through the second and third regions to the third electrode portion connected to the first region. In this state, the depletion layer extends from an interface between the first and fourth regions toward the first region. Since the depth of the fourth region changes as the position moves in the direction crossing the direction of the current flow, the position of the end of the depletion layer changes in accordance with the depth of the fourth region. Thereby, the current can flow through the first region near a position immediately under the end of the depletion layer, which is formed in the direction crossing the direction of the current flow, and is located in a shallower position. This depletion layer reduces an electric field. As a result, rising of the on resistance can be suppressed while keeping an effect of reducing the electric field in the on state.

Preferably, the fourth region is fixed to a constant potential.

In this case, instability of the potential on the fourth region is overcome, and the depletion layer can be sufficiently extended from the interface between the fourth and first regions so that the electric field can be reduced more reliably.

More specifically, the fourth region is fixed to a constant potential owing to electrical connection to the first or second electrode portion.

Preferably, the fourth regions are formed discretely, and the neighboring fourth regions are spaced from each other by a distance which allows connection between the depletion layers extending from the neighboring fourth regions, respectively, in an on state.

Even in the above case where the fourth region is not continuously formed, but is formed discretely, the depletion layers extending from the neighboring fourth regions are connected together in the on state so that the effect of reducing the electric field can be kept. Further, in a portion where the depletion layers extending from the neighboring fourth regions are connected together, the end of the depletion layer is located in a shallower position, and the current can flow through the first region near the position immediately under this end so that prevention of the current flow can be suppressed.

More specifically, assuming that the first region has an impurity concentration of NA, the fourth region has an impurity concentration of ND, the neighboring fourth regions are spaced by a distance of W, a required breakdown voltage is V, an amount of charges is q, a dielectric constant of the vacuum is $\epsilon$, a relative dielectric constant of silicon is $\epsilon'$, and the impurity concentration NA is sufficiently larger than the impurity concentration ND, and is substantially infinite, it is desired that the following formulas are satisfied in the case where the fourth region is formed discretely:

$$V > qN_D W^2/(8\epsilon\epsilon')$$

$$W < 2(2V\epsilon\epsilon'/(qN_D))^{(1/2)}$$

Since the fourth region is formed to satisfy the foregoing relationships, rising of the on resistance in the on state can be suppressed while keeping the effect of reducing the electric field.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 33A shows the relationship in a structure not provided with a P-type diffusion region, and FIG. 33B shows the relationship in a structure provided with a P-type diffusion region.

DESCRIPTION OF THE PREFERRED EMBODIMENTS

First Embodiment

Figure 1:
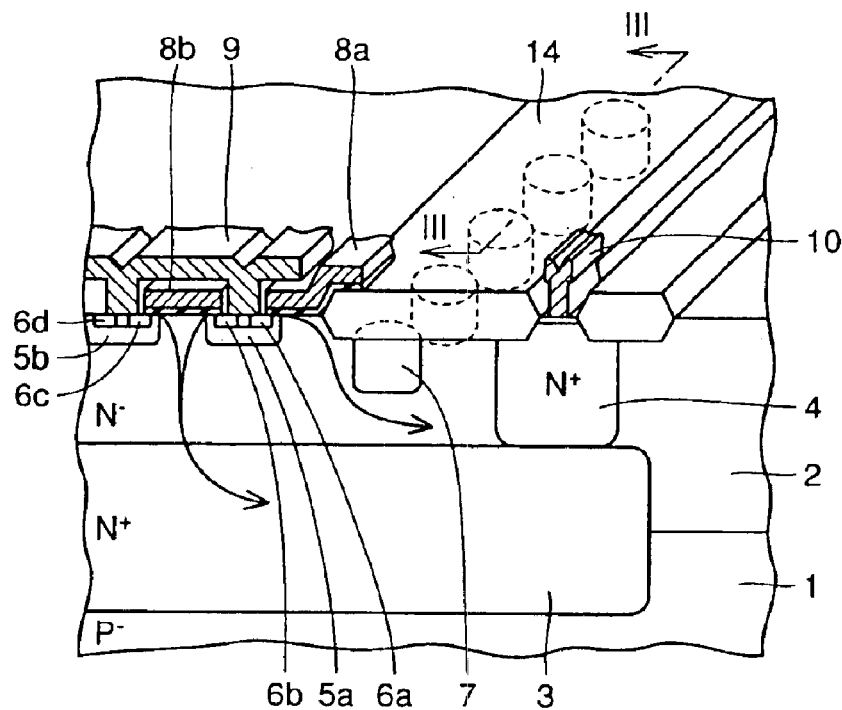
FIG. 1 is a perspective sectional view of a semiconductor device according to a first embodiment of the invention.

Description will be given on a semiconductor device provided with DMOS transistors according to a first embodiment of the invention. As shown in FIG. 1, an $N^-$-type epitaxial layer 2 is formed on a p-type silicon substrate 1. An $N^+$-type embedded diffusion region 3 is formed between p-type silicon substrate 1 and $N^-$-type epitaxial layer 2. $N^+$-type diffusion regions 6a–6d serving as second regions are formed at and near the surface of $N^-$-type epitaxial layer 2.

A P-type diffusion region 5a, which surrounds $N^+$-type diffusion regions 6a and 6b, and serves as a third region, is formed at and near the surface of $N^-$-type epitaxial layer 2. The structure is also provided with a P-type diffusion region 5b serving as the third region and surrounding $N^+$-type diffusion regions 6c and 6d. A gate electrode portion 8a serving as a first electrode portion is formed on the surface of P-type diffusion region 5-a, which is located between $N^+$-type diffusion region 6a and $N^-$-type epitaxial layer 2, with an insulating film therebetween.

A gate electrode portion 8b serving as a first electrode is formed on the surface of P-type diffusion region 5a, which is located between $N^+$-type diffusion region 6b and $N^-$-type epitaxial layer 2, and the surface of P-type diffusion region 5b, which is located between $N^+$-type diffusion region 6c and N—type epitaxial layer 2, with an insulating film therebetween. A source electrode 9, which serves as a second electrode portion, is electrically connected to $N^+$-type diffusion regions 6a–6d.

A region formed between $N^+$-type diffusion regions 6a and 6b is a p+ type region (bearing no reference number), and therefore $N^+$-type diffusion regions 6a and 6b are fixed to the same potential as P-type diffusion region 5a via source electrode 9.

A field isolating film 14 is formed at and near the surface of $N^-$-type epitaxial layer 2. A drain electrode 10 is formed in a position spaced from gate electrode portion 8a with field isolating film 14 therebetween. Drain electrode 10 is electrically connected to $N^+$-type diffusion layer 4 formed at $N^-$-type epitaxial layer 2.

P-type diffusion regions 7 serving as a fourth region are formed in a discrete fashion under field isolating film 14 and between source and drain electrode 9 and 10. P-type diffusion regions 7 are spaced from each other by a predetermined distance in a direction crossing a direction of current flow, as will be described later. P-type diffusion regions 7 are formed in positions surrounding a region where a DMOS transistor is formed.

In this semiconductor device, one of the plurality of DMOS transistors includes, e.g., $N^+$-type diffusion region 6a, $N^-$-type epitaxial layer 2, P-type diffusion region 5a and gate electrode portion 8a.

The semiconductor device described above operates as follows. By applying a predetermined voltage to gate electrode portions 8a and 8b, channel regions are formed in P-type diffusion regions 5a and 5b, respectively. Thereby, a current flows from source electrode 9 and $N^+$-type diffusion regions 6a–6d toward drain electrode 10 via these channel regions and $N^-$-type epitaxial layer 2. Thereby, the structure attains the on state.

Figure 2:
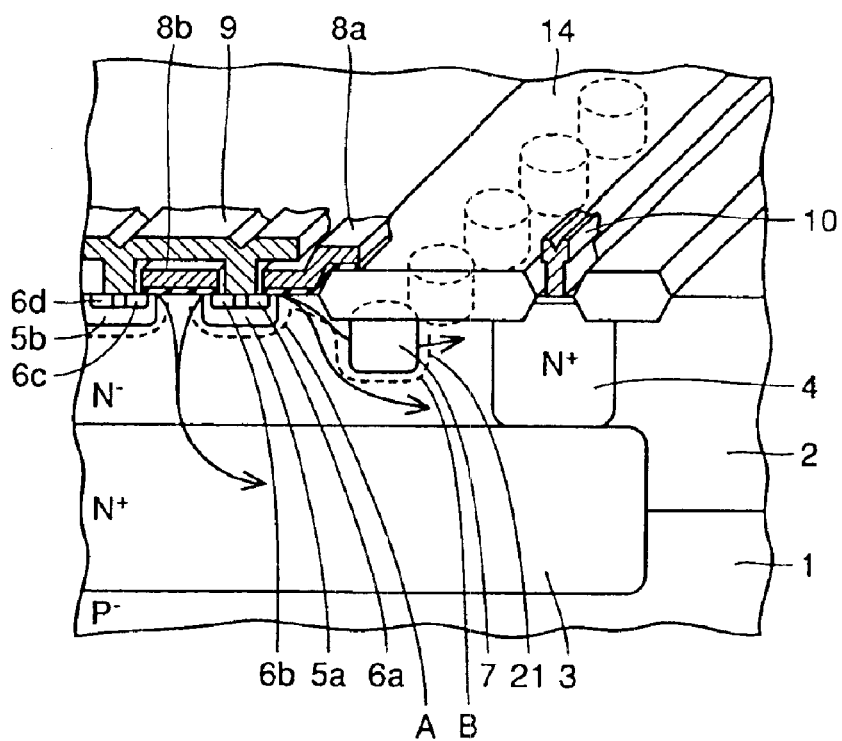
FIG. 2 is a perspective sectional view showing flow of currents in an on state of the first embodiment.

In the above operation, as shown in FIG. 2, depletion layers A extend from the interfaces between P-type diffusion regions 5a and 5b and $N^-$-type epitaxial layer 2 toward $N^-$-type epitaxial layer 2, and a depletion layer B extends from an interface between P-type diffusion region 7 and $N^-$-type epitaxial layer 2 toward N—type epitaxial layer 2.

Figure 3:
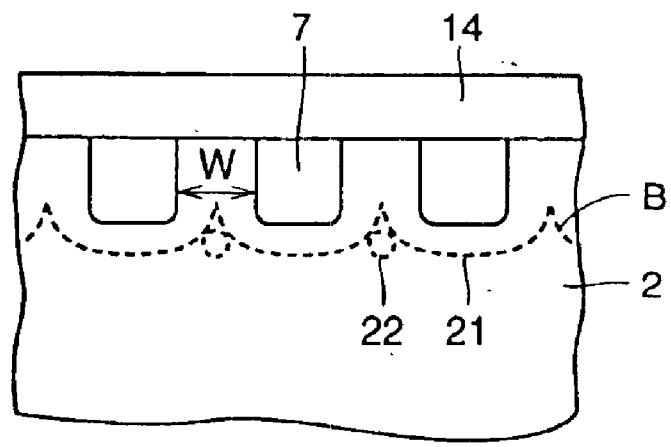
FIG. 3 is a fragmentary cross section showing, on an enlarged scale, the structure of the first embodiment and taken along line III—III in FIG. 1.

Since P-type diffusion regions 7 are spaced from each other by the predetermined distance, and are formed discretely, depletion layers B extending from neighboring P-type diffusion regions 7 join to each other as shown in FIG. 3. A position of a depletion layer end 21 where depletion layers B join to each other is shallower than positions of other ends of the depletion layers.

In the on state, a current can flow through a portion 22 of $N^-$-type epitaxial layer 2 near a position immediately under this depletion layer end 21, and therefore such a situation that a current flow is prevented can be suppressed. Further, an effect of reducing an electric field can be kept by depletion layer B extending from the interface between P-type diffusion region 7 and $N^-$-type epitaxial layer 2.

For suppressing rising of the on resistance in the on state while keeping the effect of reducing the electric field as described above, it is necessary that P-type diffusion regions 7 are formed discretely, and are spaced by a predetermined distance from each other in the direction crossing the direction of the flow of current from source electrode 9 to drain electrode 10, and the following conditions are required.

Assuming that $N^-$-type epitaxial layer 2 has an impurity concentration of NA, P-type diffusion region 7 has an impurity concentration of ND, neighboring P-type diffusion regions 7 are spaced by a distance of W, a required breakdown voltage is V, an amount of charges is q, a dielectric constant of the vacuum is $\epsilon$, a relative dielectric constant of silicon is $\epsilon'$, and impurity concentration ND of P-type diffusion region 7 is sufficiently larger than impurity concentration $N_A$ of N$^-$-type epitaxial layer 2, and is substantially infinite, the following formulas must be satisfied.

$$V > qN_D W^2/(8\epsilon\epsilon')$$

$$W < 2(2V\epsilon\epsilon'/(qN_D))^{(1/2)}$$

As shown in FIG. 3, the distance W between neighboring P-type diffusion regions 7 satisfies the foregoing relationships, whereby rising of the on resistance in the on state can be suppressed while keeping the effect of reducing the electric field.

For forming N$^-$-type epitaxial layer 2 having a specific resistance of, e.g., 1.6 Ωcm, the impurity concentration of $3\times10^{15}$/cm$^3$ is employed. For forming the element having the breakdown voltage of 60 V under the above conditions, the voltage takes on the value of about 37 V if neighboring P-type diffusion regions 7 are spaced by a distance W of 8 μm.

Figure 4:
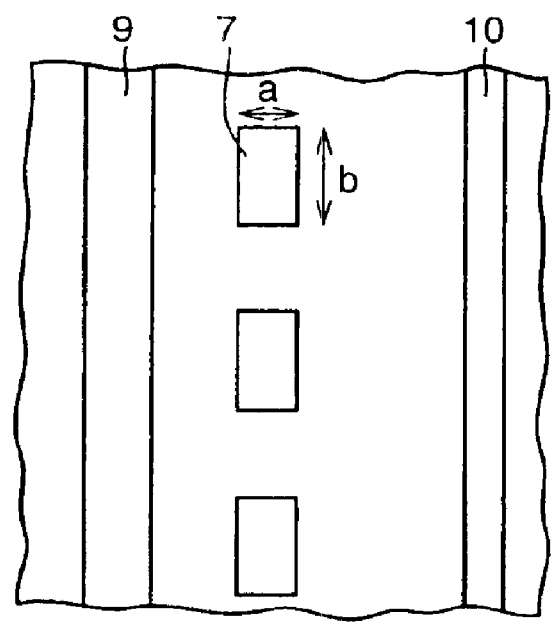
FIG. 4 shows another planar pattern of P-type diffusion regions in the first embodiment.

Although P-type diffusion region 7 shown in FIG. 1 has a substantially circular planar form, it may have a square form of a by b in length as shown in FIG. 4.

Figure 5:
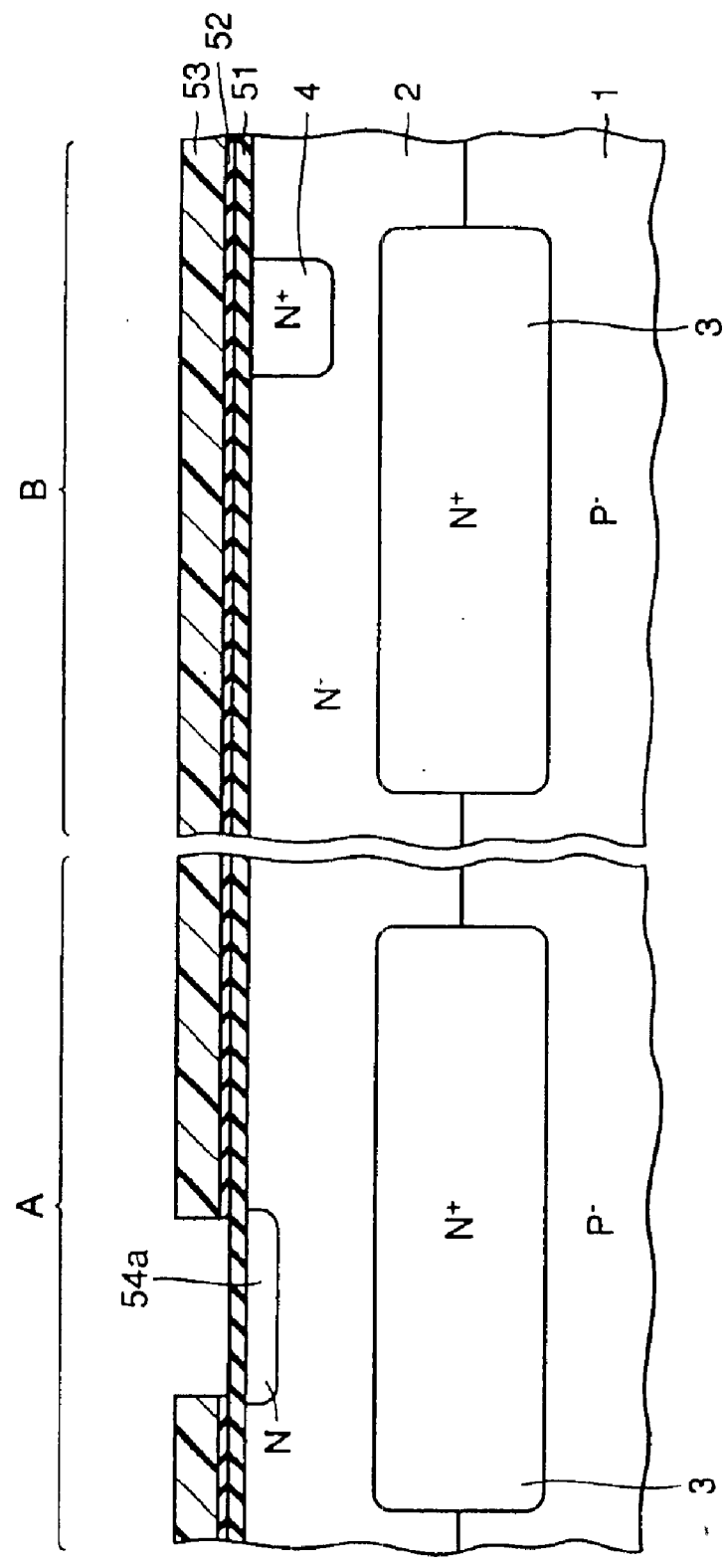
FIG. 5 is a cross section showing a step in a method of manufacturing a semiconductor device of the first embodiment.

An example of the method of manufacturing the semiconductor device described above will now be described. As shown in FIG. 5, p-type silicon substrate 1 is subjected to implantation of n-type impurity, and is thermally processed. An epitaxial growth method is executed to form N-type epitaxial layer 2 on p-type silicon substrate 1, and further N$^+$-type embedded diffusion regions 3 are formed. Then, N$^+$-type diffusion layers 4 are formed in predetermined regions of N—type epitaxial layer 2.

A base or underlying oxide film 51 is formed on N—type epitaxial layer 2. A silicon nitride film 52 is formed on base oxide film 51. A photoresist 53 is formed on silicon nitride film 52. Etching is effected on silicon nitride film 52 masked with photoresist 53 to expose the surface of base oxide film 51. Using photoresist 53 as a mask, n-type impurity is implanted by an ion implanting method to form an n-type region 54a forming an n-well.

In FIG. 5, a CMOS region A is employed as a region for forming a CMOS transistor, and a DMOS region B is employed as a region for forming a DMOS transistor.

Figure 6:
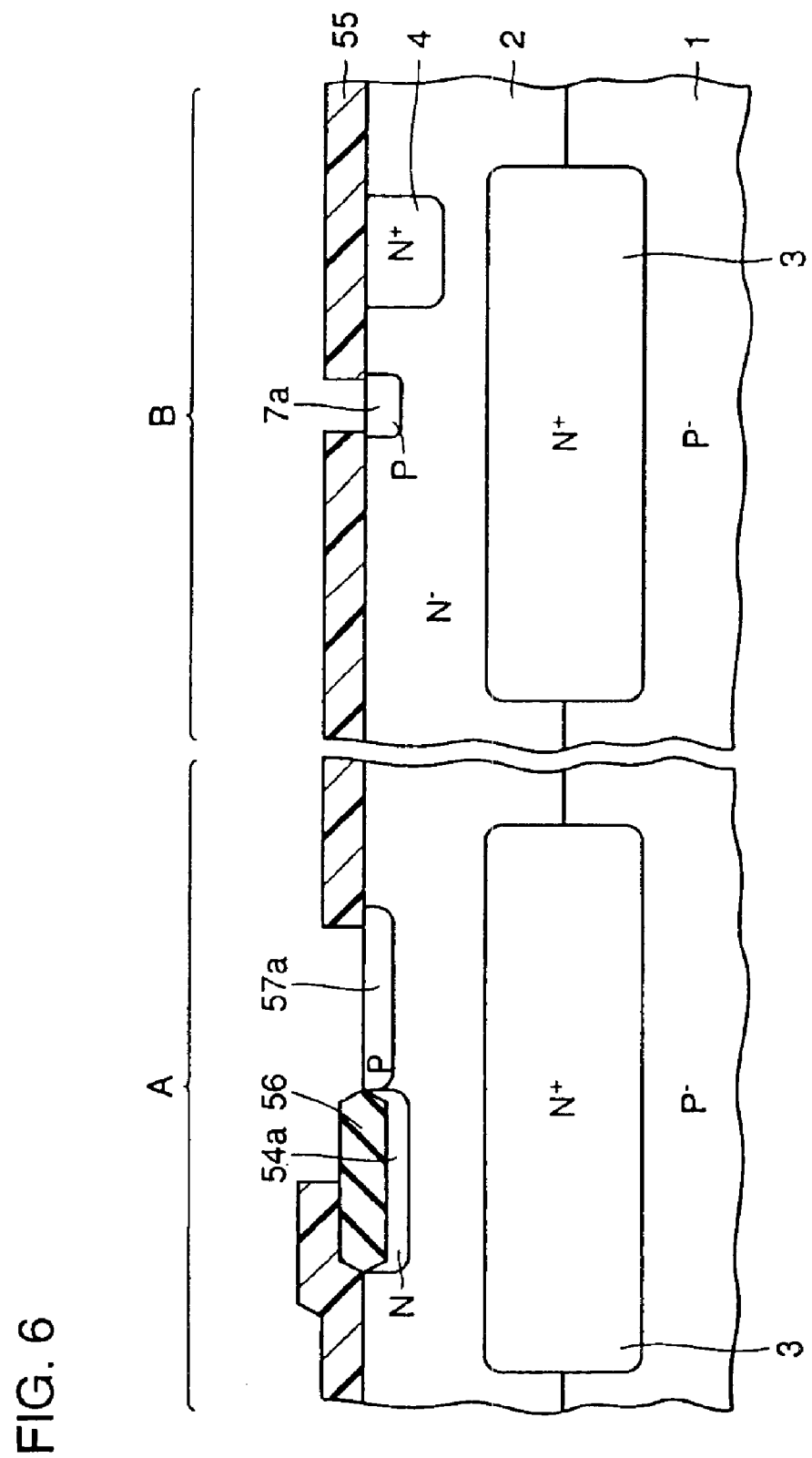
FIGS. 6–13 are cross sections showing steps performed successively in the first embodiment.

Then, as shown in FIG. 6, an island oxide film 56 is formed by a thermal oxide method. A photoresist 55 is formed on N$^-$-type epitaxial layer 2. Using photoresist 55 as a mask, processing is executed to form a p-type region 7a forming the P-type diffusion region in DMOS region B. Also, p-type region 57a forming the p-well is formed in the CMOS region.

Figure 7:
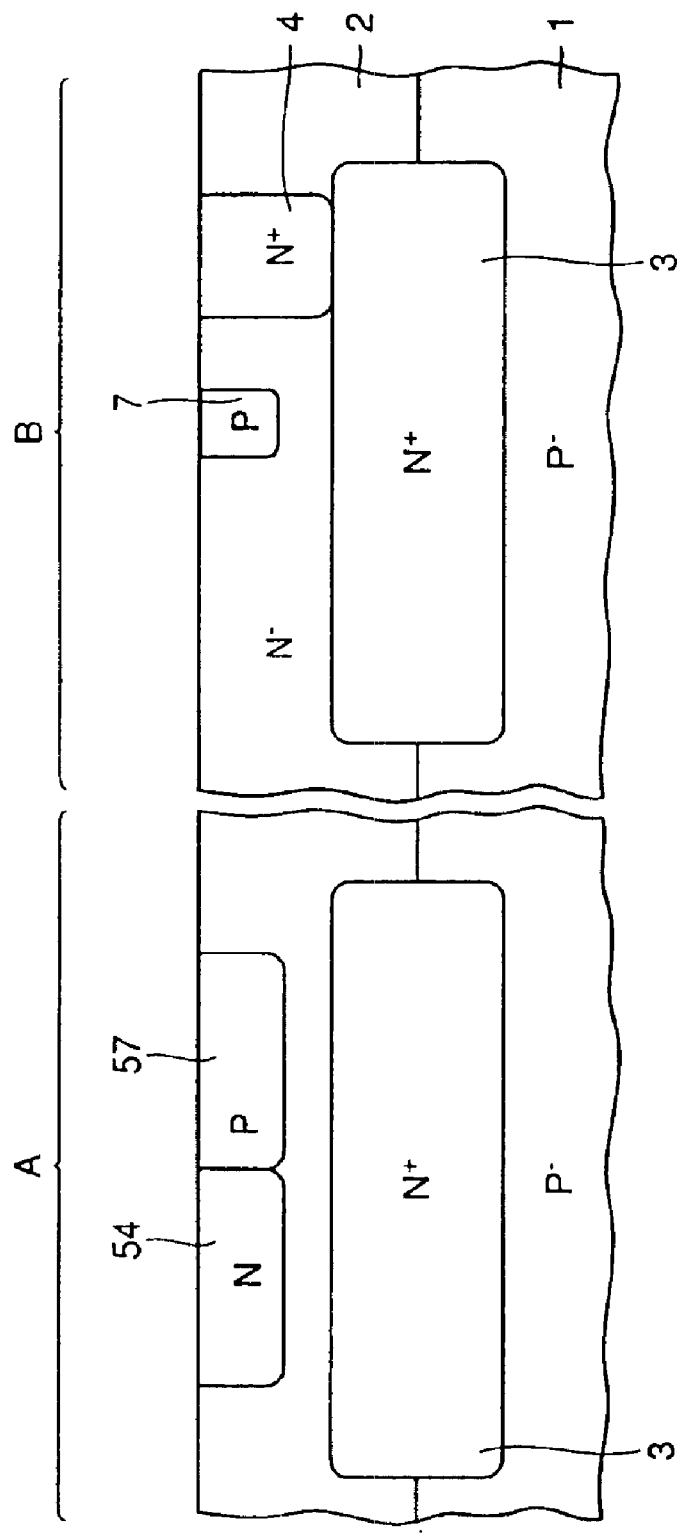
Figure 8:
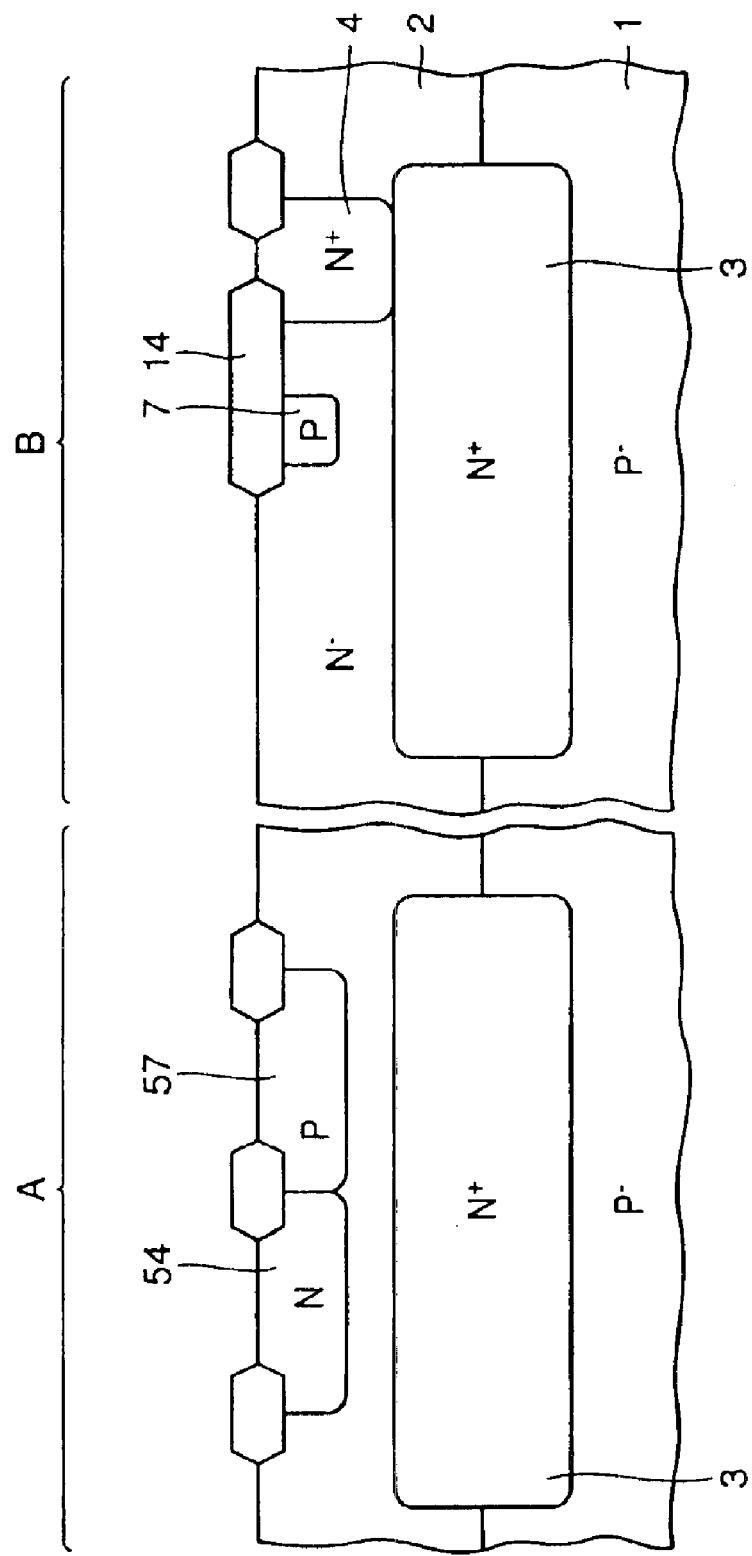

Then, as shown in FIG. 7, island oxide film 56 is removed, and predetermined thermal processing is effected to form P-type diffusion region 7 in DMOS region B. Further, n-well 54 and p-well 57 are formed in CMOS region A. Then, as shown in FIG. 8, predetermined field isolating film 14 is formed for electrically isolating the elements from each other.

Figure 9:
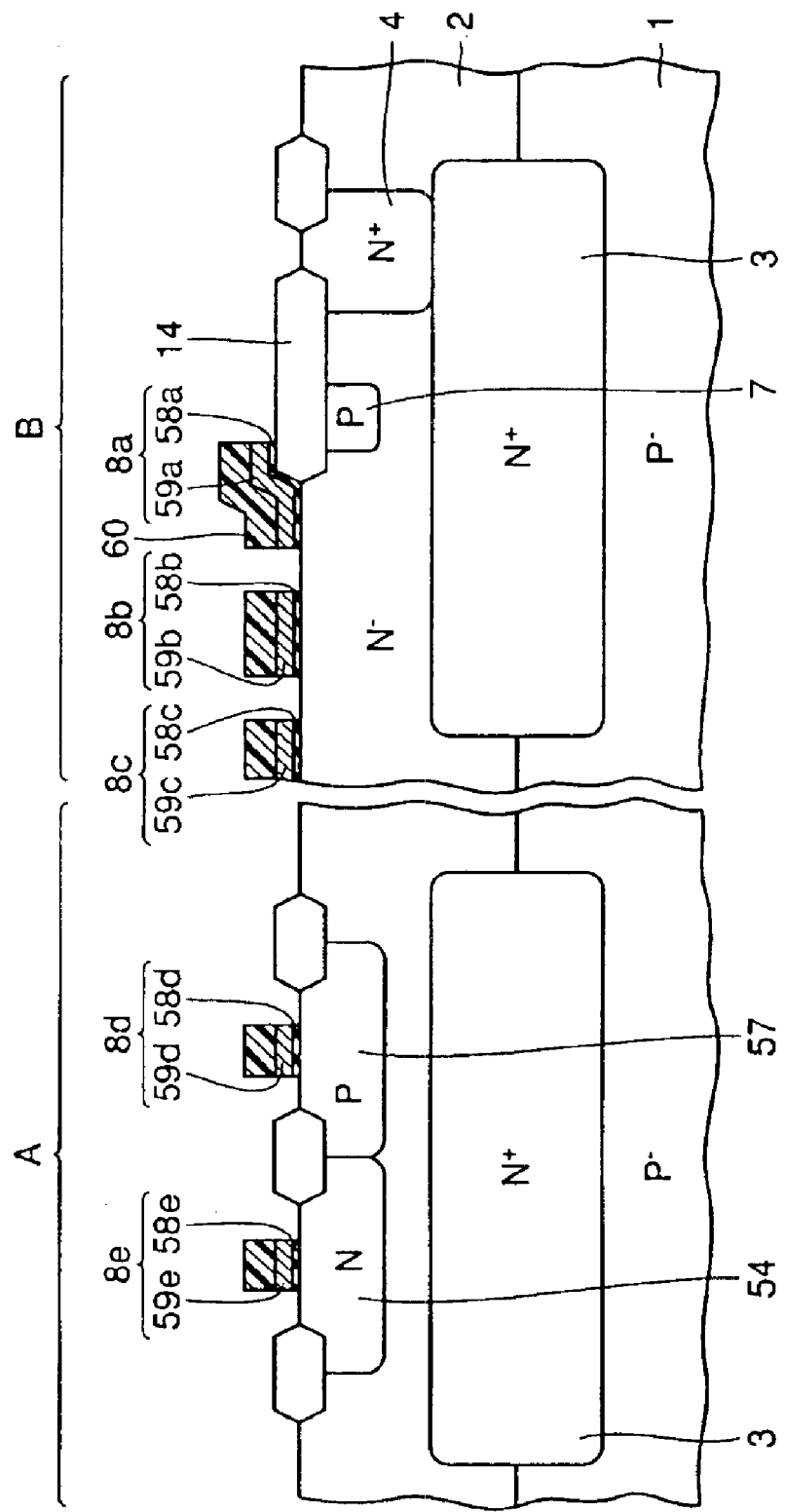

Then, as shown in FIG. 9, a polycrystalline silicon film (not shown) is formed on N$^-$-type epitaxial layer 2 with a silicon oxide film, which will form the gate oxide film, therebetween. A photoresist 60 is formed on the polycrystalline silicon film thus formed. Using photoresist 60 as a mask, anisotropic etching is effected on the polycrystalline silicon film and the silicon oxide film to form gate electrode portions 8a–8e which include gate oxide films 58a–58e and polycrystalline silicon gate electrodes 59a–59e, respectively.

Figure 10:
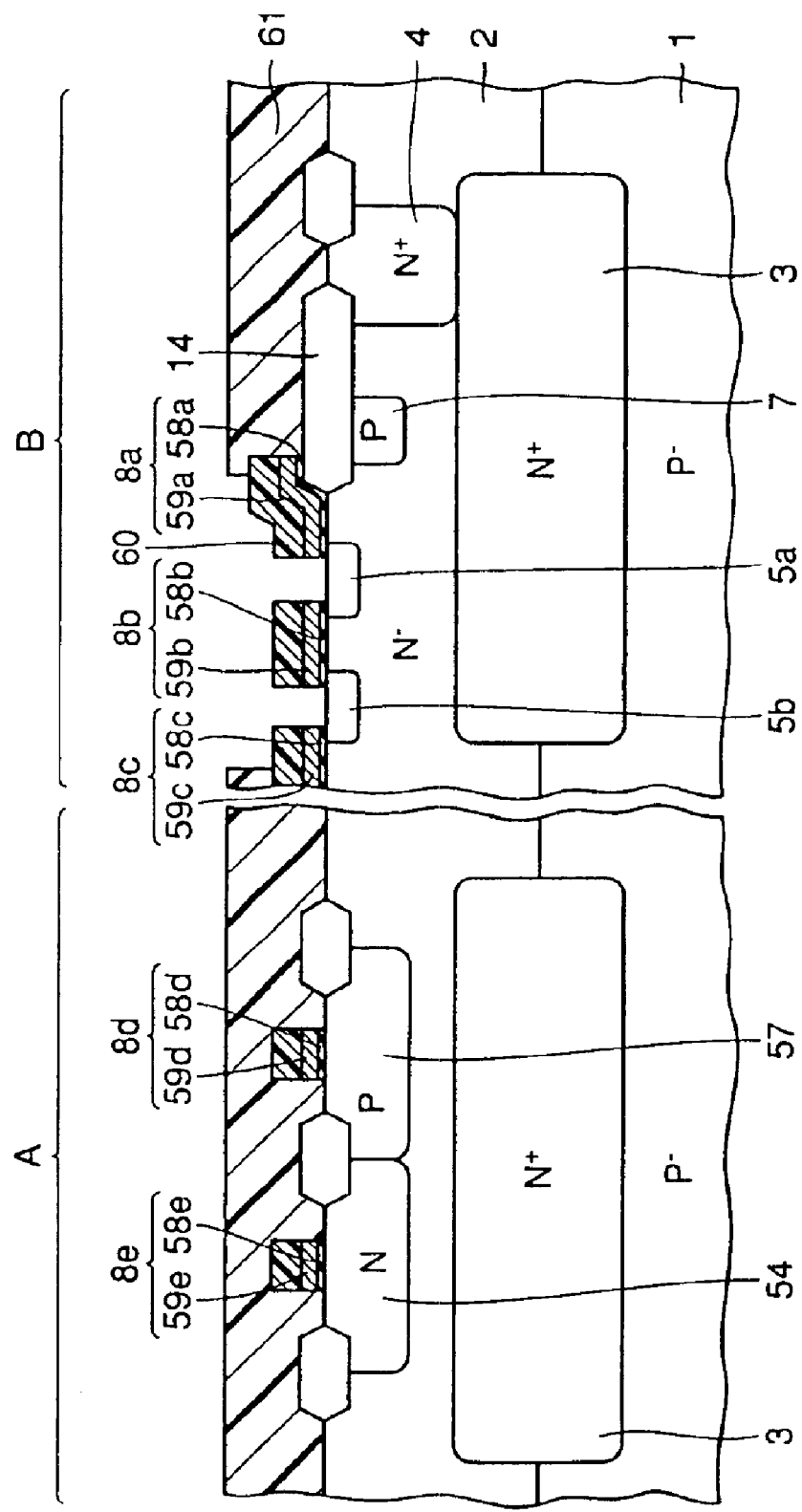

Then, as shown in FIG. 10, a photoresist 61 is formed on N$^-$-type epitaxial layer 2. Using photoresist 61 as a mask, boron is implanted by the ion implanting method to form P-type diffusion regions 5a and 5b. Thereafter, photoresists 60 and 61 are removed.

Figure 11:
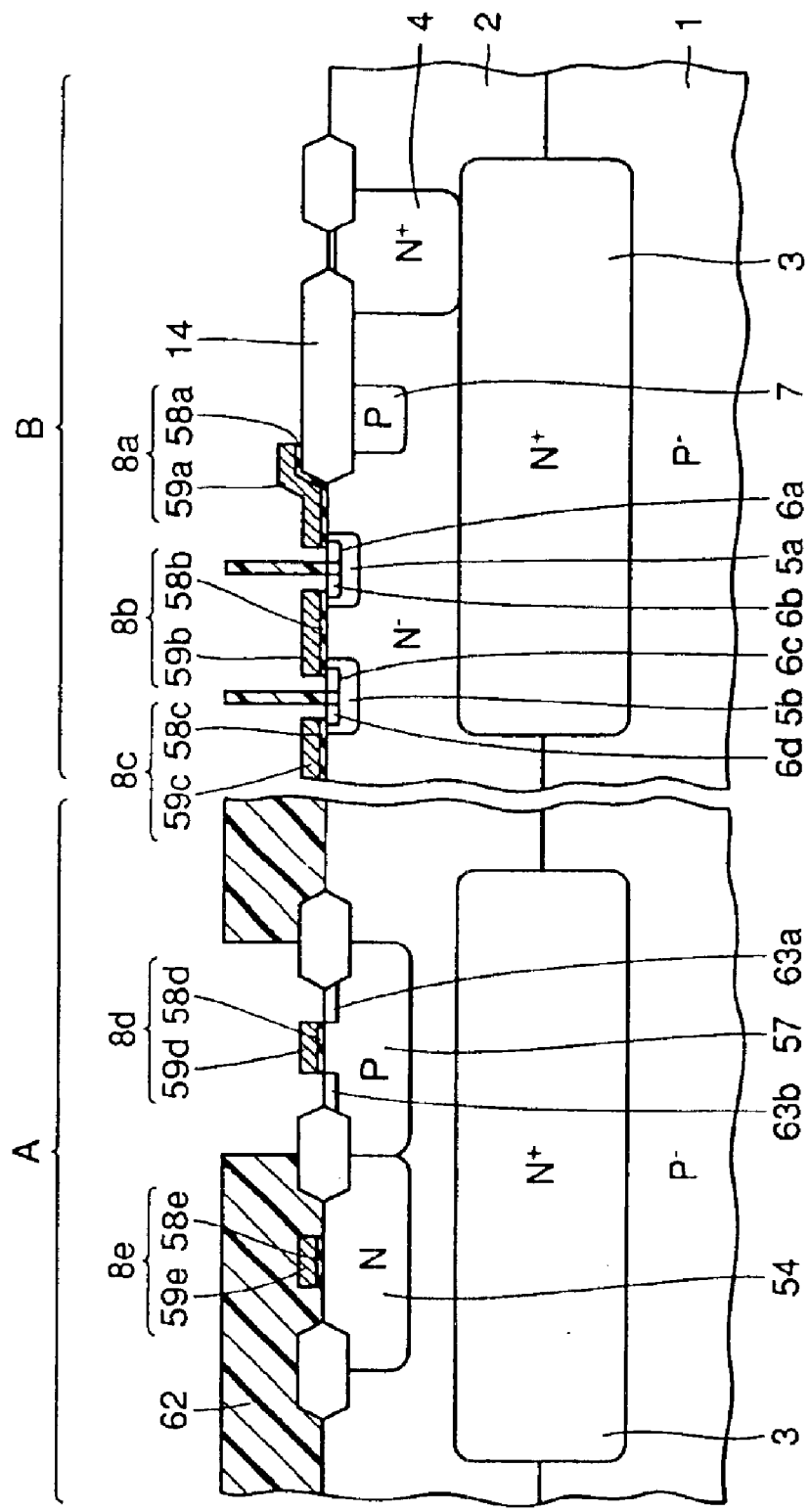
Figure 12:
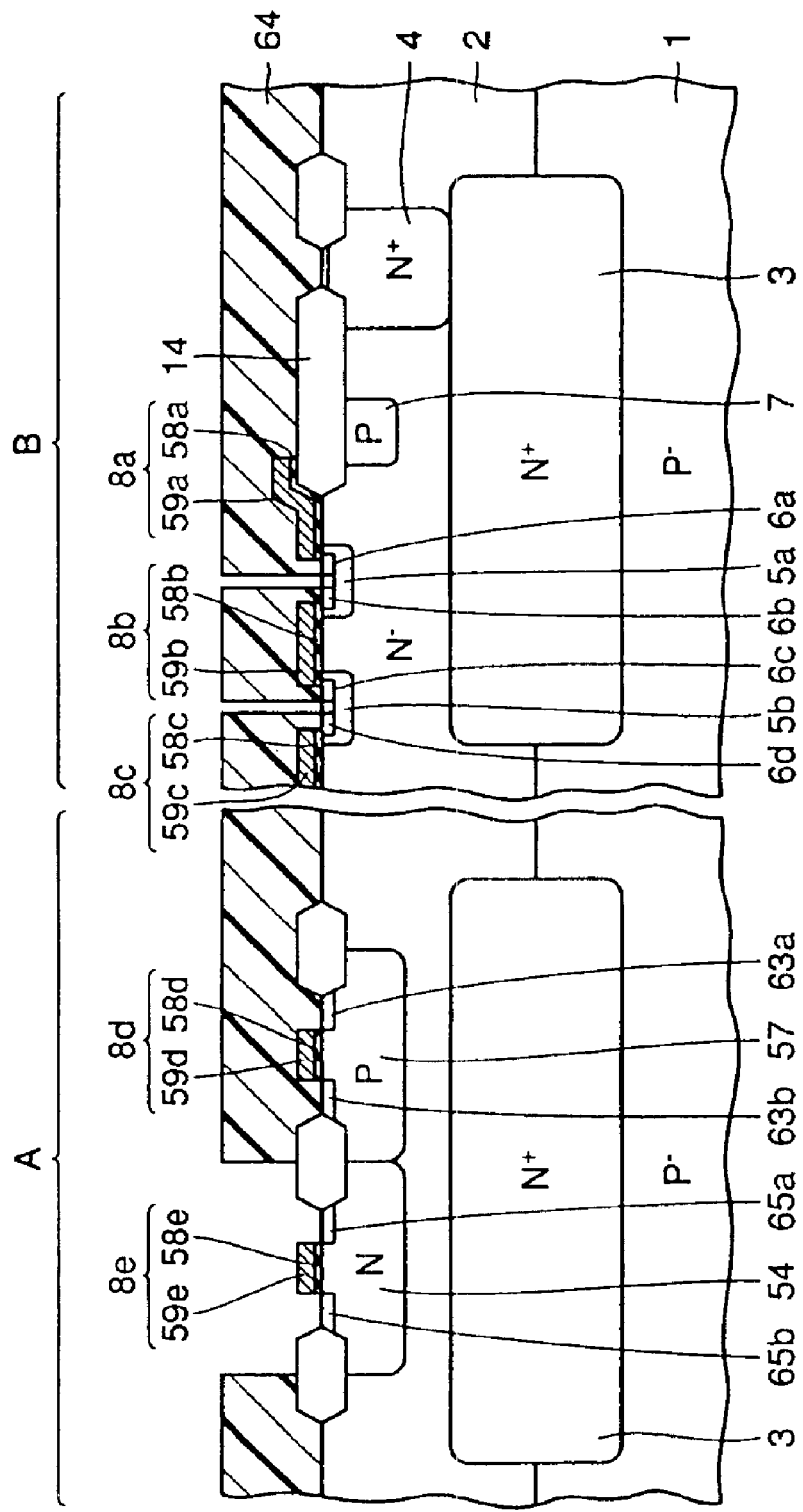

Then, as shown in FIG. 11, a photoresist 62 is formed on N$^-$-type epitaxial layer 2. Using photoresist 62 as a mask, arsenic is implanted by the ion implanting method to form N$^+$-type diffusion regions 6a–6d and N$^+$-type source/drain regions 63a and 63b. Then, as shown in FIG. 12, a photoresist 64 is formed. Using photoresist 64 as a mask, boron is implanted by ion implanting method so that P$^+$-type source/drain regions 65a and 65b are formed.

Figure 13:
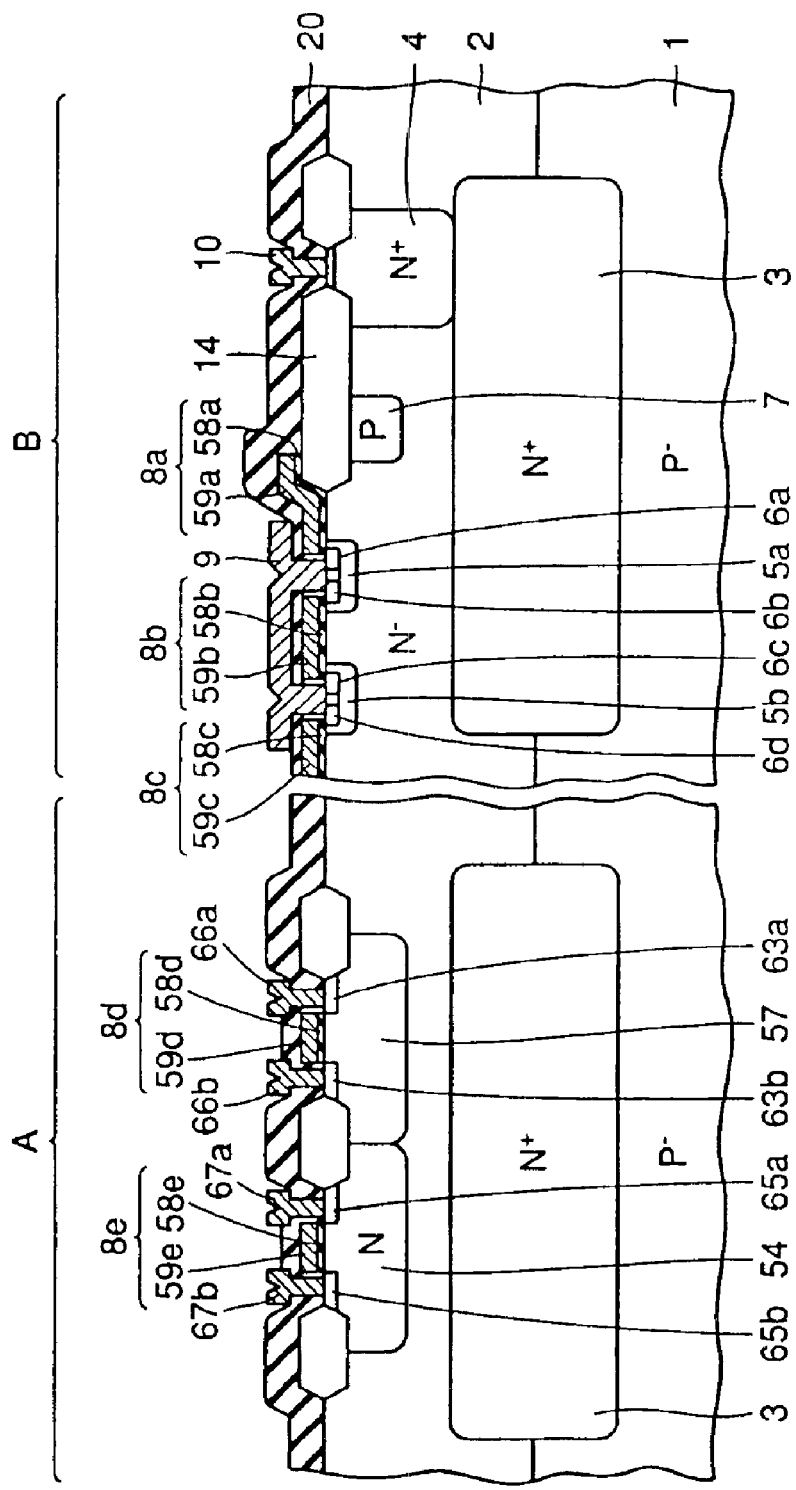

Then, as shown in FIG. 13, a silicon oxide film 20, which covers gate electrode portions 8a–8e and will serve as an interlayer insulating film, is formed on N—type epitaxial layer 2. Predetermined contact holes (not shown) are formed in silicon oxide film 20. A predetermined metal film (not shown) filling the contact holes is formed on silicon oxide film 20.

Predetermined photolithography and processing are effected on this metal film to form drain electrode 10 which is electrically connected to N+ type diffusion layer 4. Also, source electrode 9 electrically connected to N$^+$-type diffusion regions 6a–6d are formed. Further, source/drain electrodes 66a and 66b, which are electrically connected to N$^+$-type source/drain regions 63a and 63b, respectively, are formed. Source/drain electrodes 67a and 67b, which are electrically connected to P$^+$-type source/drain regions 65a and 66b, respectively, are formed.

In the foregoing manners, the MOS transistors of the n-channel and p-channel types are formed in CMOS region A, and the DMOS transistors are formed in DMOS region B so that a major portion of the semiconductor device is completed.

Figure 14:
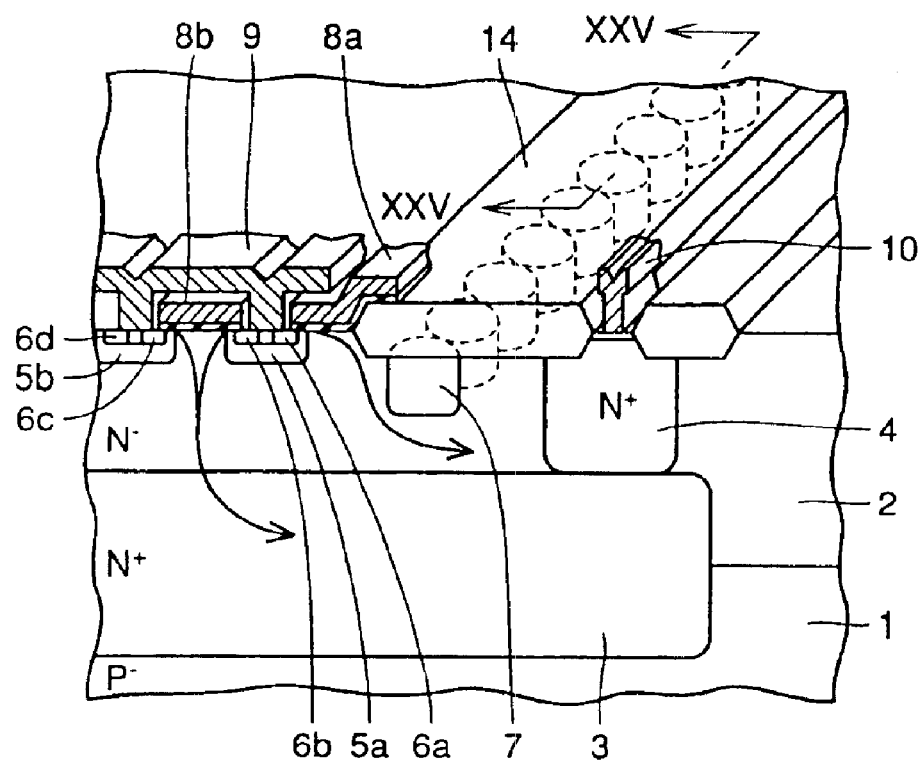
FIG. 14 is a perspective sectional view of a semiconductor device according to a second embodiment of the invention.
Figure 15:
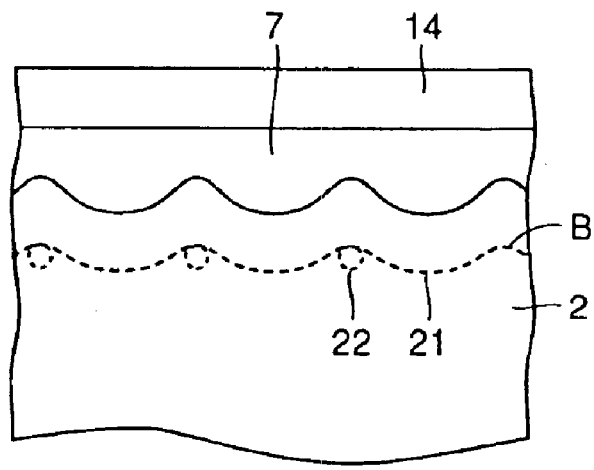
FIG. 15 is a fragmentary cross section showing, on an enlarged scale, a structure of the second embodiment and taken along line XXV—XXV in FIG. 14.

In the foregoing manufacturing method, it is particularly necessary that p-type regions 7a which are formed in the step shown in FIG. 6, and will form P-type diffusion regions 7, respectively, must be spaced by predetermined distance W satisfying the foregoing relationship after being subjected to the final process. Therefore, p-type regions 7a are initially spaced by a distance larger than distance W in view of a diffusion length of impurity caused by thermal processing.
Second Embodiment A semiconductor device of a second embodiment of the invention will now be described. In the semiconductor device of the first embodiment, P-type diffusion regions 7 are arranged discretely in the direction crossing the direction of the current flow. As shown in FIGS. 14 and 15, P-type diffusion region 7 in the second embodiment is formed continuously in the direction crossing the direction of the current flow, but has a variable depth. Structures other than the above are substantially the same as those of the semiconductor device of the first embodiment shown in FIG. 1. The same parts and portions bear the same reference numbers, and description thereof is not repeated.

In the semiconductor device described above, the depth of P-type diffusion region 7 changes as the position moves in the direction crossing the direction of the current flow, as shown in FIG. 15. In the on state, depletion layer B extends from the interface between P-type diffusion region 7 and N—type epitaxial layer 2 toward N—type epitaxial layer 2. Since the depth of P-type diffusion region 7 changes as the position moves in the direction crossing the direction of the current flow, the position of the end of the depletion layer changes in accordance with the depth of P-type diffusion region 7.

Thereby, the current can flow through portion 22 of N⁻-type epitaxial layer 2 near a position immediately under end 21 of depletion layer B, which is formed in the direction crossing the current flow direction, and is located in a shallower position. Thereby, such a situation that the current flow is prevented is suppressed. Further, depletion layer B extending from the interface between P-type diffusion region 7 and N⁻-type epitaxial layer 2 keeps the effect of reducing the electric field. As a result, rising of the on resistance in the on state can be suppressed while keeping the effect of reducing the electric field.

A method of manufacturing the semiconductor device of this embodiment is the basically same as the manufacturing method in the first embodiment already described. In particular, P-type diffusion region 7 in this semiconductor device is formed continuously in the direction crossing the direction of the current flow, and has the variable depth depending on positions in its lengthwise direction.

Figure 16:
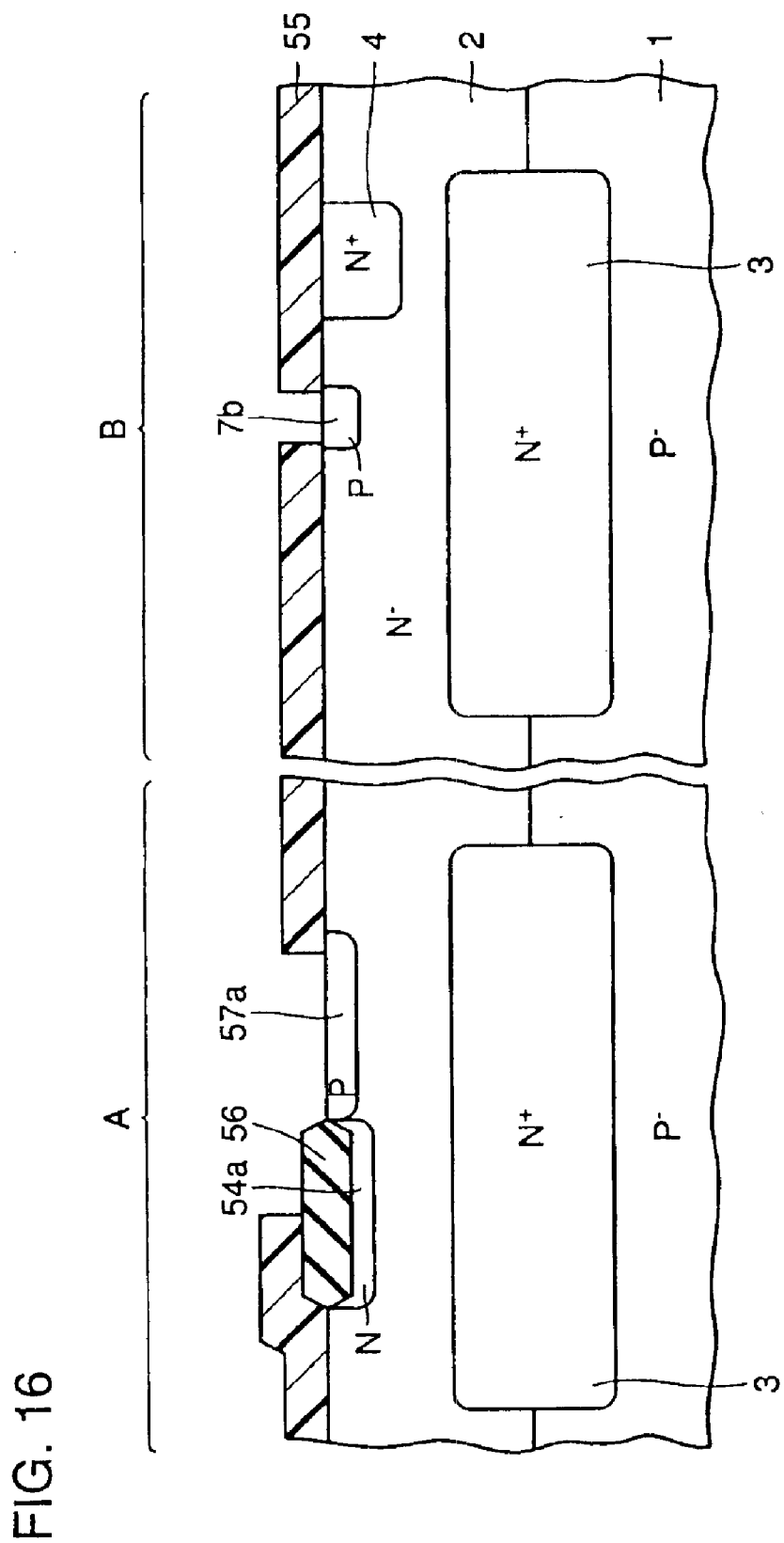
FIG. 16 is a cross section showing a step in a method of manufacturing the semiconductor device of the second embodiment.

In the process of manufacturing the semiconductor device of this embodiment, therefore, the step of forming p-type region 7b, which is shown in FIG. 16 and will form the P-type region, must be executed such that neighboring p-type regions 7b will finally continue together at and near their surfaces as shown in FIG. 15.

Third Embodiment

Figure 17:
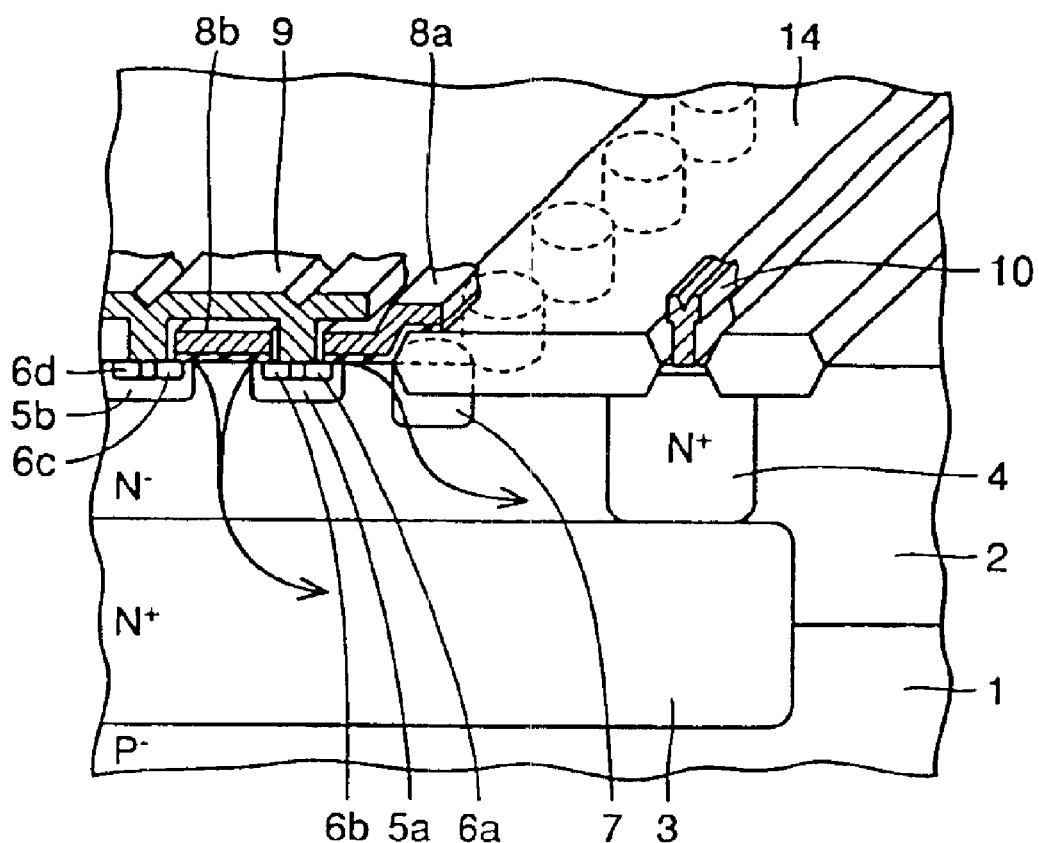
FIG. 17 is a perspective sectional view of a semiconductor device according to a third embodiment of the invention.

A semiconductor device according to a third embodiment of the invention will now be described. The semiconductor device of the third embodiment includes P-type diffusion regions 7, which are formed along an end of field isolating film 14, as shown in FIG. 17. P-type diffusion regions 7 are formed in a discrete fashion similarly to those in the semiconductor device of the first embodiment. However, P-type diffusion region 7 may be formed continuously, and may have a variable depth similarly to the semiconductor device of the second embodiment. Structures other than the above are substantially the same as those of the semiconductor device of the first embodiment already described. The same parts and portions bear the same reference numbers, and description thereof is not repeated.

In the semiconductor device described above, the depletion layer extends from the interface between P-type diffusion region 7 and N⁻-type epitaxial layer 2 toward N—type epitaxial layer 2 in the on state. The position of the depletion layer end, where the depletion layers extending from neighboring P-type diffusion regions 7 are joined together, is shallower than the position of the other depletion ends.

Thereby, the current can flow through a portion of N⁻-type epitaxial layer 2 near a position immediately under the depletion layer end in the on state, and prevention of the current flow can be suppressed. As a result, the effect of reducing the electric field can be kept, and further the rising of the on resistance in the on state can be suppressed.

In this semiconductor device, P-type diffusion regions 7 are formed along the end of field isolating film 14. Generally, the electric field tends to concentrate in a region near the end of field isolating film 14. By forming P-type diffusion region 7 in the region in which the electric field is liable to concentrate, the electric field can be effectively reduced.

P-type diffusion regions 7 which are formed along the end of field isolating film 14 can be formed in a self-aligning manner by implanting boron before field oxidation.

Then, an example of the manufacturing method will be described. In the step which is shown in FIG. 6, and is already described in connection with the first embodiment, boron is implanted to form simultaneously p-type region 57a forming the p-well and p-type region 7a forming P-type diffusion region 7.

Figure 18:
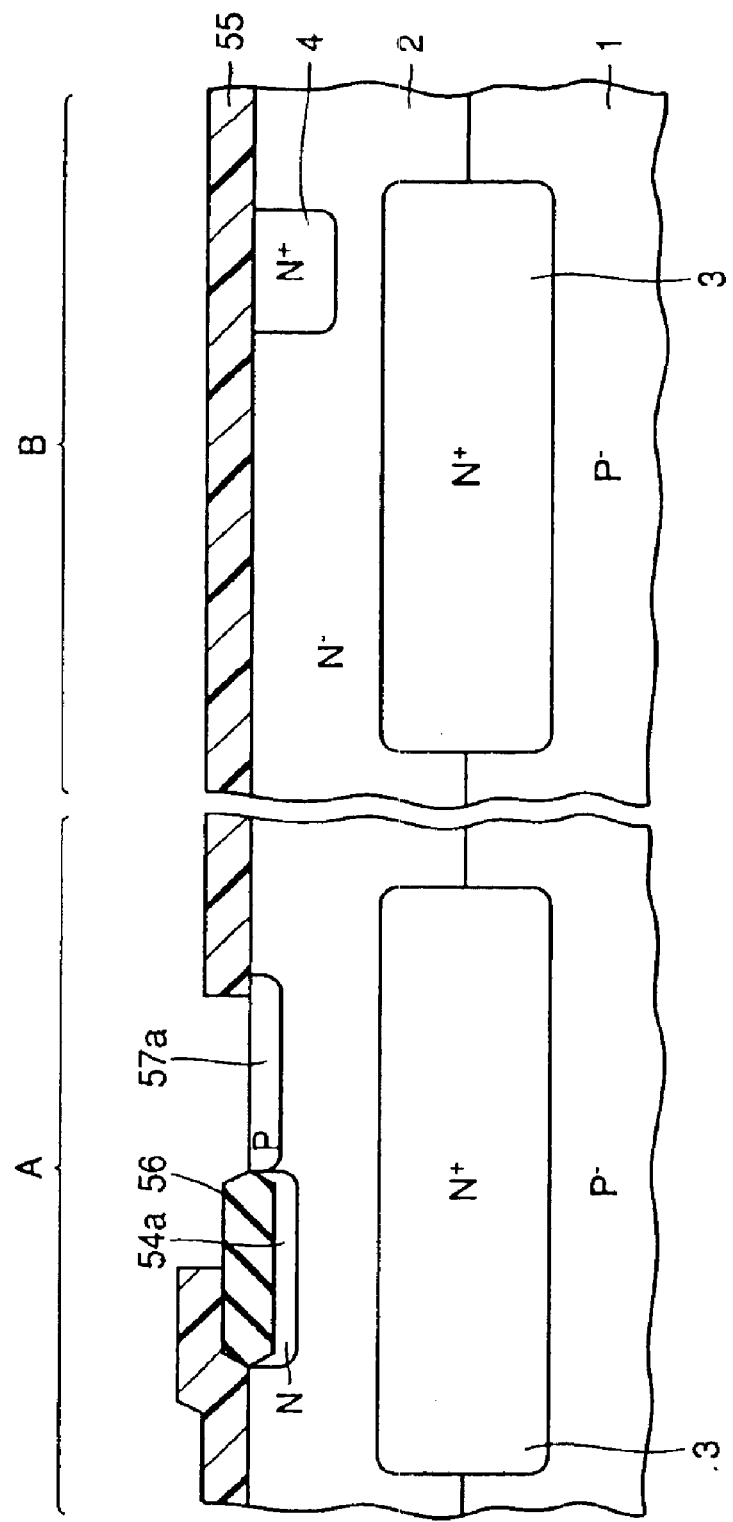
FIG. 18 is a cross section showing a step in a method of manufacturing a semiconductor device of the third embodiment.
Figure 19:
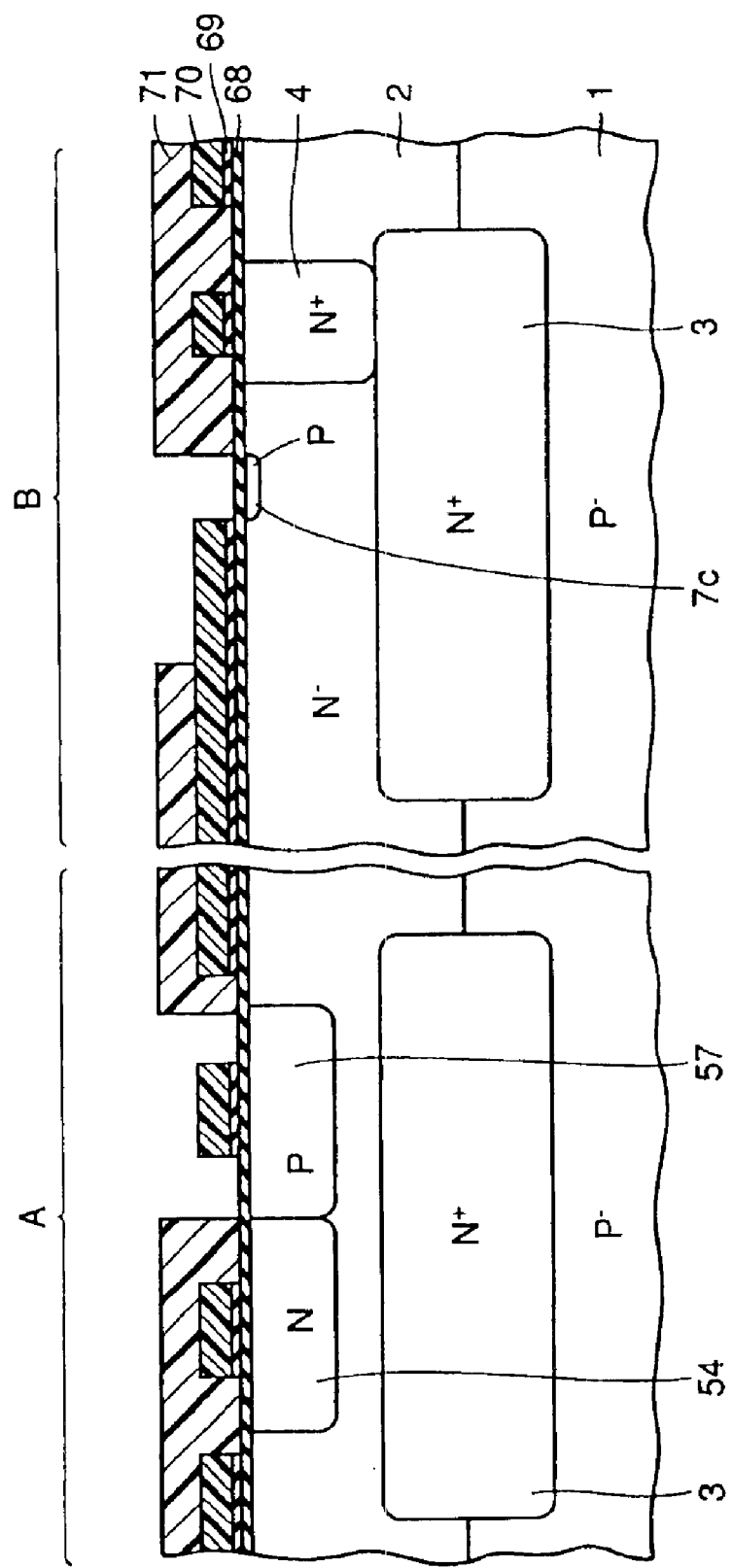
FIGS. 19–21 are cross sections showing steps performed successively in the third embodiment.

In the semiconductor device of this embodiment, as shown in FIG. 18, the p-type region is not formed, and only p-type region 57a forming the p-well is formed. Then, as shown in FIG. 19, island oxide film 56 is removed, and predetermined thermal processing is effected to form n-well 54 and p-well 57. Thereby, a thermal oxide film 68 is formed on N⁻-type epitaxial layer 2.

A silicon nitride film 69 is formed on thermal oxide film 68. A photoresist 70 is formed on silicon nitride film 69. Using photoresist 70 as a mask, etching is effected on silicon nitride film 69 to expose the surface of thermal oxide film 68. Further, a photoresist 71 is formed.

Using photoresists 71 and 70 as a mask, boron is implanted by the ion implanting method so that p-type region 7c forming P-type diffusion region 7 is formed in the end of the region, where the field isolating film (not shown) is formed, in a self-aligning manner. Thereafter, photoresists 70 and 71 are removed.

Figure 20:
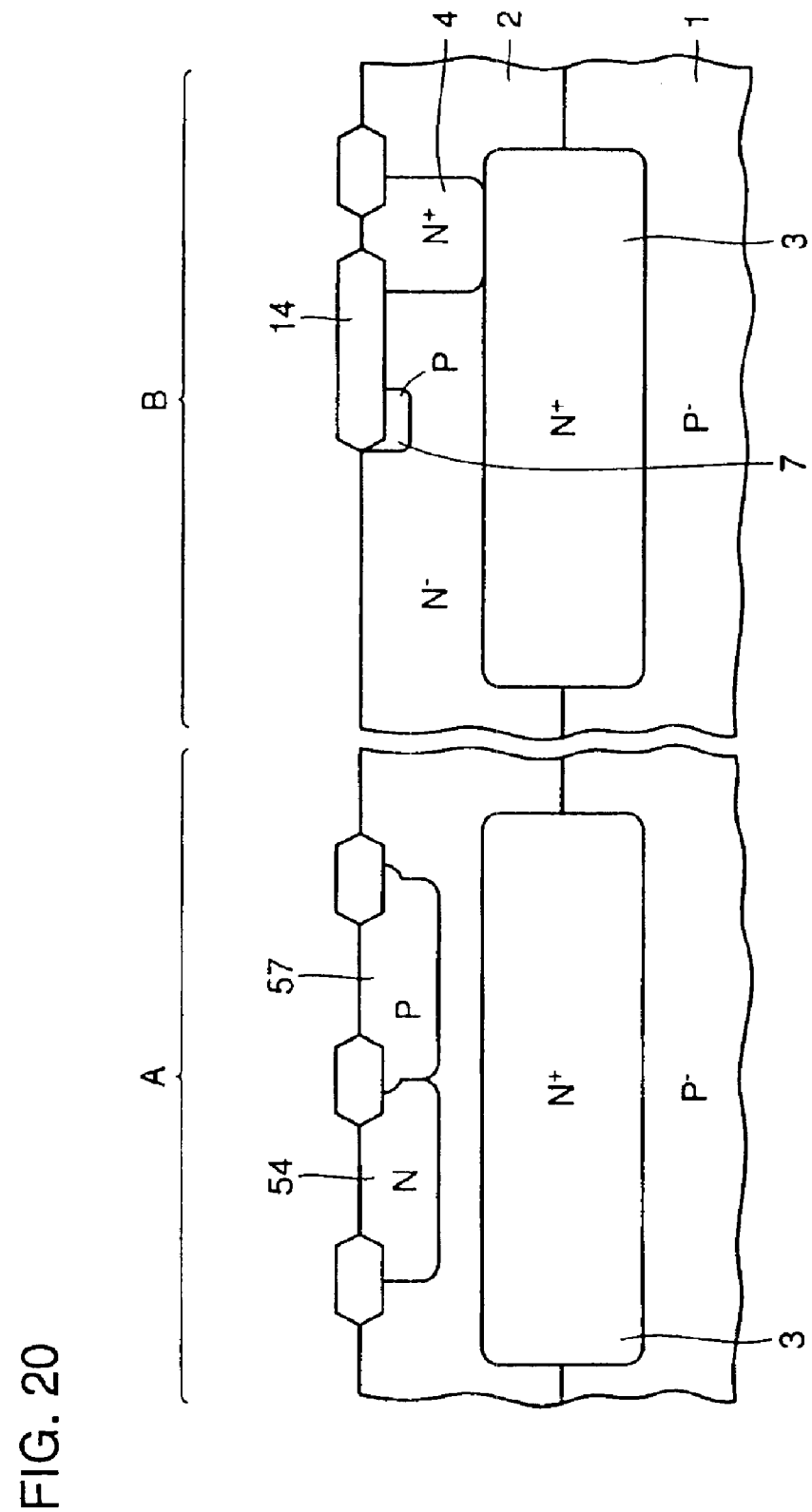
Figure 21:
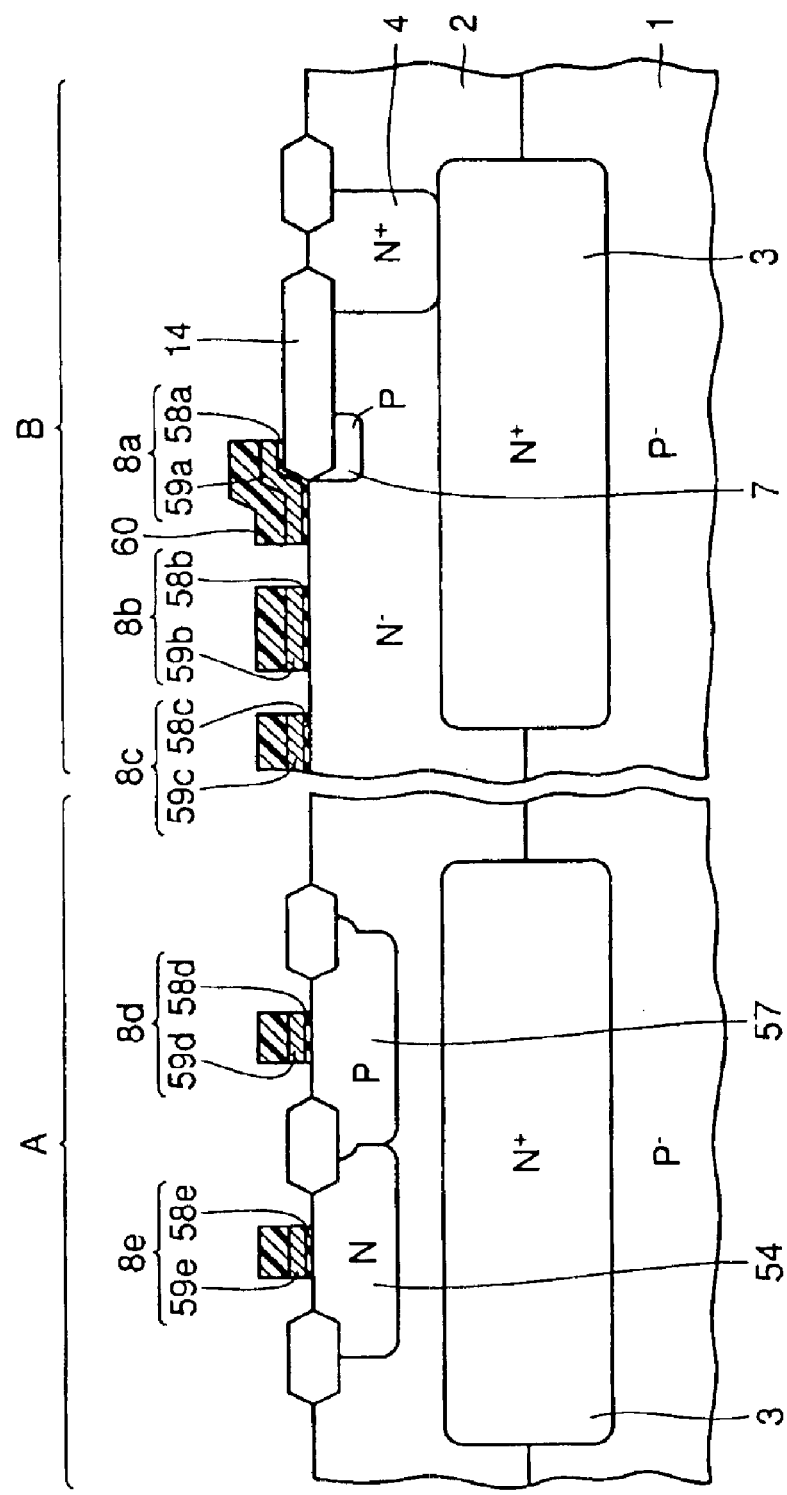

As shown in FIG. 20, predetermined thermal processing is effected to form field isolating film 14. Then, gate electrode portions 8a–8e, which include gate oxide films 58a–58e and polycrystalline silicon gate electrodes 59a–59e, respectively, are formed as shown in FIG. 21. Thereafter, processing is performed through steps similar to those of the first embodiment shown in FIGS. 10 to 13 so that the semiconductor device shown in FIG. 17 is completed.

By utilizing the pattern of the base or underlying layer which is formed before forming the field isolating film, P-type diffusion region 7 which is located along the end of field isolating film 14 can be easily formed in a self-aligning manner.

Fourth Embodiment

In the semiconductor devices of the first to third embodiments already described, P-type diffusion region 7 is formed in N⁻-type epitaxial layer 2 under the field insulating film, and is electrically floated.

Figure 22:
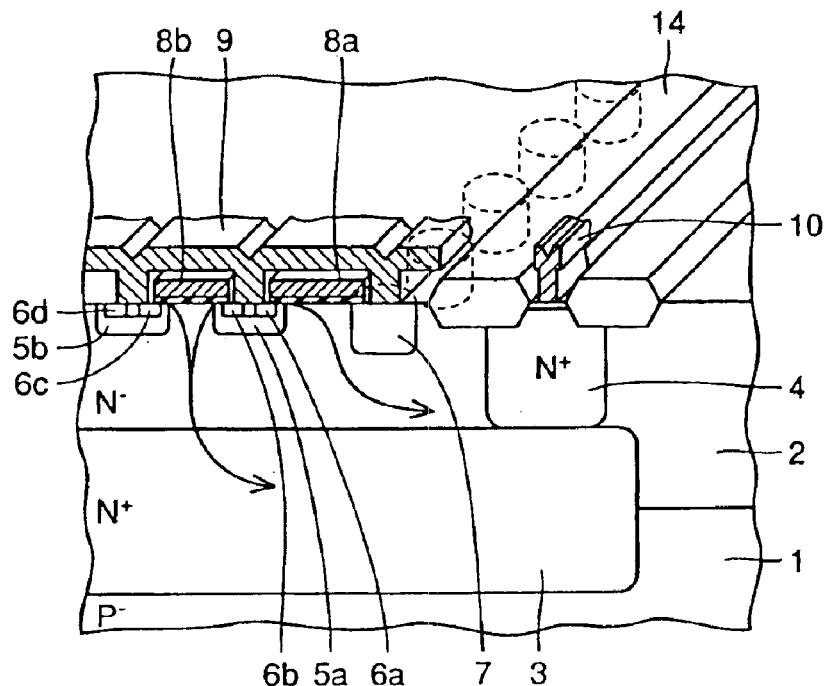
FIG. 22 is a perspective sectional view of a semiconductor device according to a fourth embodiment of the invention.

The semiconductor device according to the fourth embodiment of the invention, which will now be described, has the P-type diffusion region which is fixed to a constant potential. The P-type diffusion region cannot be fixed to the constant potential if it is formed under the field oxide film. Therefore, P-type diffusion regions 7 in the semiconductor device of this embodiment are formed discretely at and near the surface of N⁻-type epitaxial layer 2, as shown in FIG. 22.

Figure 23:
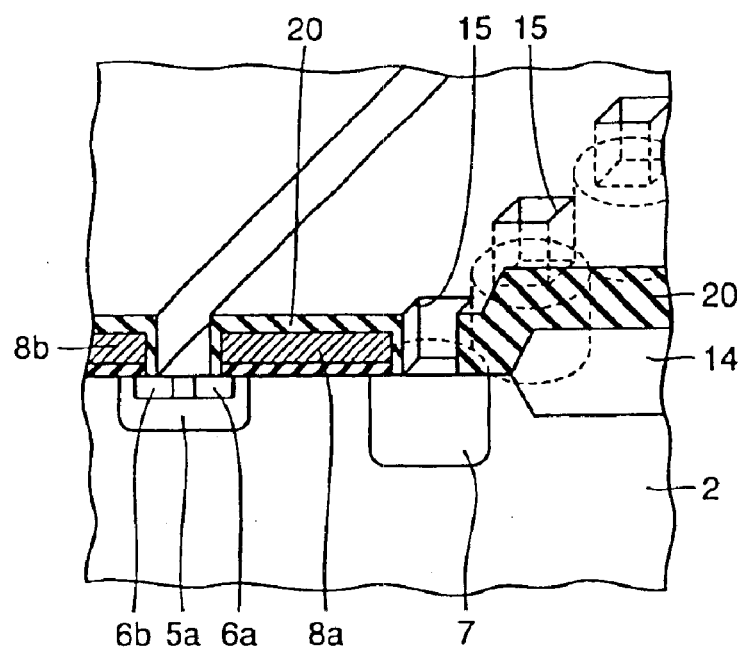
FIG. 23 is a fragmentary perspective view showing, on an enlarged scale, a section of a structure of and around a P-type diffusion region of the semiconductor device of the fourth embodiment shown in FIG. 22.

In this semiconductor device, each P-type diffusion region 7 is fixed to the source potential. In particular, as shown in FIG. 23, each P-type diffusion region 7 is electrically connected to source electrode 9 via a contact hole 15, which is formed in silicon oxide film 20 and exposes the surface of corresponding P-type diffusion region 7. In alternative embodiments, each P-type diffusion region 7 is electrically connected to gate electrode 8a. Structures other than the above are substantially the same as those of the semiconductor device shown in FIG. 1. The same parts and portions bear the same reference numbers, and description thereof is not repeated.

The semiconductor device of the fourth embodiment can achieve the following effect in addition to the effect achieved by the first embodiment. In the case where P-type diffusion region 7 is electrically floated, the potential of the P-type diffusion region rises by a certain extent in a reverse bias state, and therefore the reverse bias applied across P-type diffusion region 7 and N—type epitaxial layer 2 decreases so that depletion between the neighboring P-type diffusion regions may be suppressed to a certain extent. Further, instability in potential is present if P-type diffusion region 7 is floated.

Accordingly, by fixing P-type diffusion region 7 to the source potential, the depletion layer is reliably formed between the neighboring P-type diffusion regions, and rising of the on resistance in the on state can be suppressed while keeping the effect of reducing the electric field.

In this semiconductor device, as described above, P-type diffusion region 7 is not formed under field isolating film 14, but is formed at and near the surface of N⁻-type epitaxial layer 2. Accordingly, the structure differs from the semiconductor device of the first embodiment already described only in arrangement of the P-type diffusion region, and the manufacturing method is substantially the same as that already described in connection with the first embodiment.

Fifth Embodiment

A semiconductor device of a fifth embodiment will now be described. In the semiconductor device of the fifth embodiment, the on resistance is reduced by flowing, in the on state, a larger current than the semiconductor device of the fourth embodiment.

Figure 24:
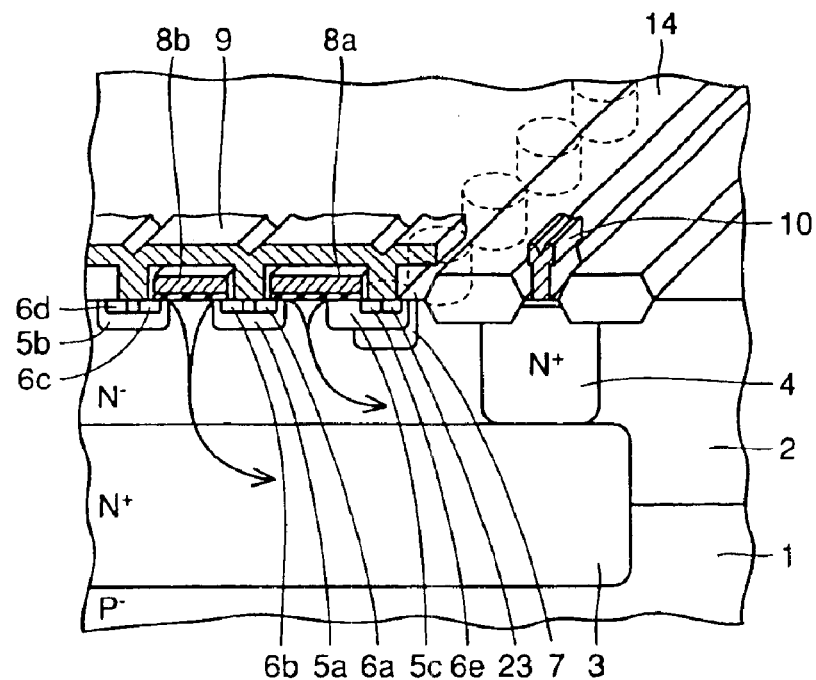
FIG. 24 is a perspective sectional view of a semiconductor device according to a fifth embodiment of the invention.

As shown in FIG. 24, an N⁺-type diffusion region 6e is formed at and near the surface of N⁻-type epitaxial layer 2. N⁺-type diffusion region 6e is surrounded by a p-type diffusion region 5c. A gate electrode portion 8a is formed on P-type diffusion region 5c located between N⁺-type diffusion region 6e and N⁻-type epitaxial layer 2 with a gate oxide film therebetween. In a position neighboring to N⁺-type diffusion region 6e, there is formed p+-type region 23 so that P-type diffusion region 5c and N⁺-type diffusion region 6e are fixed to the electrically equal potential via source electrode 9.

Figure 25:
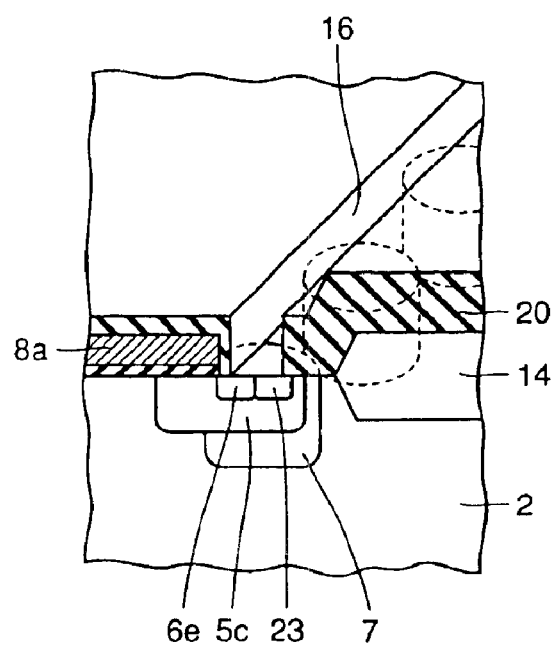
FIG. 25 is a fragmentary perspective view showing, on an enlarged scale, a section of a structure of and around a P-type diffusion region of the semiconductor device of the fifth embodiment shown in FIG. 24.

As shown in FIG. 25, a contact groove 16 which exposes the surface of P-type diffusion regions 7 formed in the discrete fashion is formed at silicon oxide film 20. Source electrode 9 is electrically connected to each P-type diffusion region 7 via contact groove 16. Structures other than the above are substantially the same as those of the semiconductor device of the fourth embodiment shown in FIG. 22. Therefore, the same parts and portions bear the same reference numbers, and description thereof is not repeated.

The semiconductor device described above can achieve the following effect in addition to those achieved by the fourth embodiment already described. This semiconductor device is provided with P-type diffusion region 5c and N⁺-type diffusion region 6e in addition to P-type diffusion regions 5a and 5b as well as N⁺-type diffusion regions 6a–6d. Gate electrode portion 8a is formed on the surface of P-type diffusion region 6c located between N⁺-type diffusion region 6e and N⁻-type epitaxial layer 2.

In this manner, the channel region is formed in P-type diffusion region 5c located between N⁺-type diffusion region 6e and N⁻-type epitaxial layer 2 in addition to the channel regions, which are formed in P-type diffusion regions 5a and 5b located between N⁺-type diffusion regions 6a–6c and N⁻-type epitaxial layer 2. Thereby, a larger current can flow in the on state, compared with the semiconductor device of the fourth embodiment already described. As a result, the channel width in the DMOS transistor can be increased, and the on resistance in the on state can be reduced.

This semiconductor device differs from the semiconductor device of the first embodiment already described in patterns of N⁺-type diffusion region, P-type diffusion region and others. The method of manufacturing the semiconductor device of this embodiment is basically the same as the method of manufacturing the semiconductor device of the first embodiment already described.

Sixth Embodiment

Figure 26:
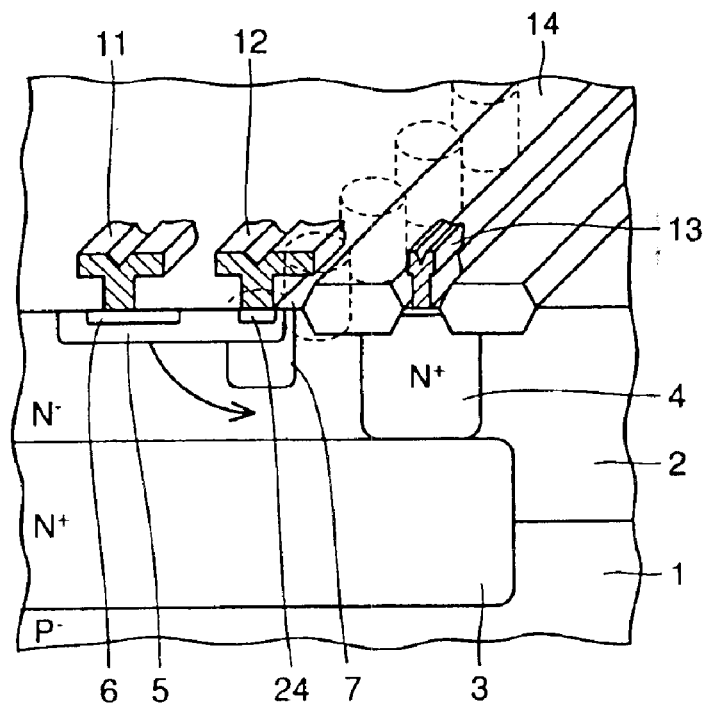
FIG. 26 is a perspective sectional view of a semiconductor device according to a sixth embodiment of the invention.

A semiconductor device having a bipolar transistor will now be described as a semiconductor device of a sixth embodiment of the invention. As shown in FIG. 26, N⁺-type diffusion region 6 is formed at and near the surface of N⁻-type epitaxial layer 2. P-type diffusion region 5 surrounding N⁺-type diffusion region 6 is formed at and near the surface of N⁻-type epitaxial layer 2. N⁺-type diffusion region 6 forms an emitter region, P-type diffusion region 5 forms a base region, and N⁻-type epitaxial layer 2 forms a collector region.

An emitter electrode 11 is electrically connected to N⁺-type diffusion region 6. A base electrode 12 is electrically connected to P-type diffusion region 5. A p⁺-type region 24 is formed between base electrode 12 and P-type diffusion region 5 for reducing a contact resistance. A collector electrode 13 is electrically connected to N⁺-type diffusion region 4. As already described in connection with the first embodiment, P-type diffusion regions 7 are formed discretely in the direction crossing the direction of the current flow in the on state.

Figure 27:
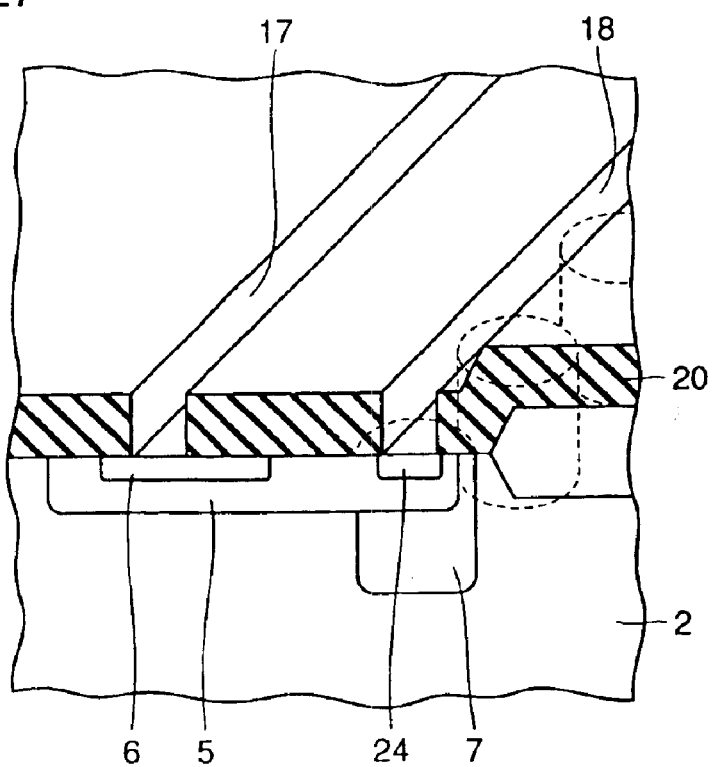
FIG. 27 is a fragmentary perspective view showing, on an enlarged scale, a section of a structure of and around a P-type diffusion region of the semiconductor device of the sixth embodiment shown in FIG. 26.

Silicon oxide film 20 formed on N⁻-type epitaxial layer 2 is provided with a contact groove 18, which exposes the surfaces of P-type diffusion regions 7 formed in the discrete fashion, as shown in FIG. 27. Also, a contact groove 17 which exposes the surface of N⁺-type diffusion region 6 is formed.

P-type diffusion regions 7 are electrically connected together via base electrode 12 filling contact groove 18. Emitter electrode 11 fills contact groove 17. Structures other than the above are substantially the same as those of the semiconductor device of the first embodiment shown in FIG. 1. The same parts and portions bear the same reference numbers, and description thereof is not repeated.

The foregoing semiconductor device operates as follows. By applying a predetermined voltage to base electrode 12, a current flows from emitter electrode 11 toward collector electrode 13 so that the on state is attained. In this operation, the depletion layer extends from the interface between P-type diffusion region 7 and N⁻-type epitaxial layer 2 toward N⁻-type epitaxial layer 2.

Since P-type diffusion regions 7 are spaced from each other by the predetermined distance, and therefore are formed discretely, the depletion layers extending from P-type diffusion regions 7 neighboring together are joined to each other. The position of depletion of layer end 21, where the depletion layers are joined together, is shallower than the position of the other depletion layer ends as already described in connection with the first embodiment shown in FIG. 3, and the current can flow through portion 22 of N⁻-type epitaxial layer 2 near a position immediately under depletion layer end 21.

Thereby, prevention of the current flow can be suppressed. Further, the depletion layer extending from the interface between P-type diffusion region 7 and N⁻-type epitaxial layer 2 can keep the effect of reducing the electric field.

The semiconductor device described above differs from the semiconductor device of the first embodiment only in patterns of the N+ type diffusion region, P-type diffusion region and others, and the method of manufacturing this semiconductor device is basically the same as that of manufacturing the semiconductor device of the first embodiment already described.

Seventh Embodiment

Figure 28:
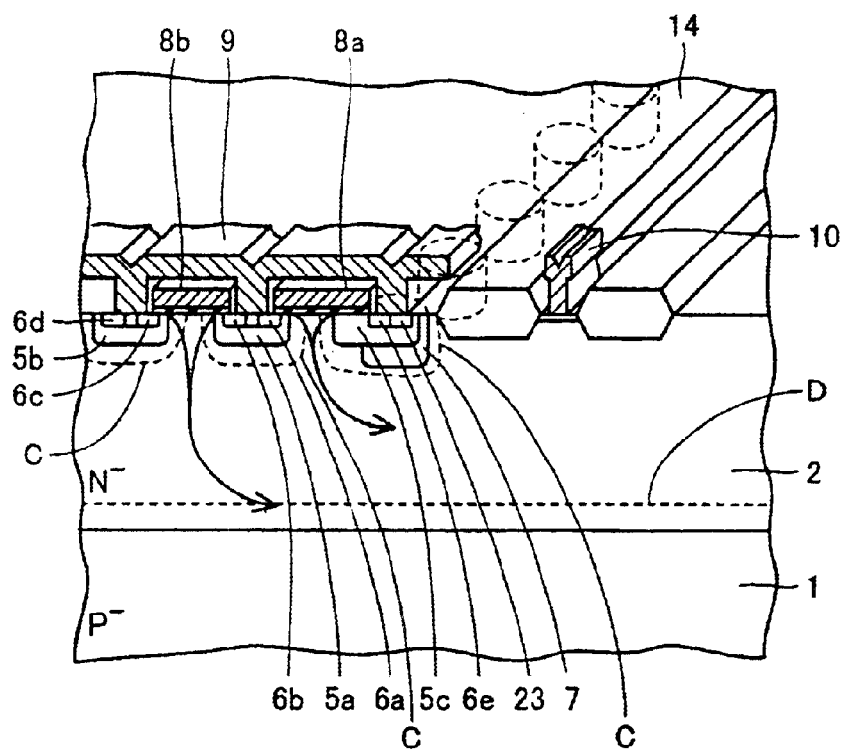
FIGS. 28–30 are perspective sectional views of semiconductor devices of seventh, eighth and ninth embodiments of the invention, respectively.

A semiconductor device of a seventh embodiment of the invention will now be described. As shown in FIG. 28, the semiconductor device of this embodiment has the substantially same structure as that of the semiconductor device of the foregoing fifth embodiment shown in FIG. 24 except for that $N^+$-type embedded region 3 and $N^+$-type diffusion layer 4 are not formed. Accordingly, the same parts and portions bear the same reference numbers, and description thereof is not repeated.

This semiconductor device can achieve the following effect in addition to the effects which are achieved by the semiconductor device of the fifth embodiment already described. In the on state, a depletion layer (depletion layer C) extends from the interfaces between $N^-$-type epitaxial layer 2 and P-type diffusion regions 5a–5c.

At the same time, a depletion layer (depletion layer D) extends also from the interface between $N^-$-type epitaxial layer 2 and p-type silicon substrate 1 toward $N^-$-type epitaxial layer 2. This extension of depletion layer D promotes the extension of depletion layer C. Thereby, the electric field at the surface of $N^-$-type epitaxial layer 2 is reduced by a Resurf (Reduced SURface Field) effect. As a result, the breakdown voltage of the semiconductor device can be further improved.

In this semiconductor device, such a situation may occur that a resistance (JFET resistance) between P-type diffusion region 7 and p-type silicon substrate 1 rises because $N^+$-type embedded diffusion region 3 is not employed. In this semiconductor device, however, P-type diffusion regions 7 are formed discretely. This suppresses excessive rising of the JFET resistance, and the on resistance of the semiconductor device in the on state can be reduced.

The semiconductor device described above differs from the semiconductor device of the first embodiment only in patterns of the $N^+$-type diffusion region, P-type diffusion region and others, and the method of manufacturing this semiconductor device is basically the same as that of manufacturing the semiconductor device of the first embodiment already described.

Eight Embodiment

Figure 29:
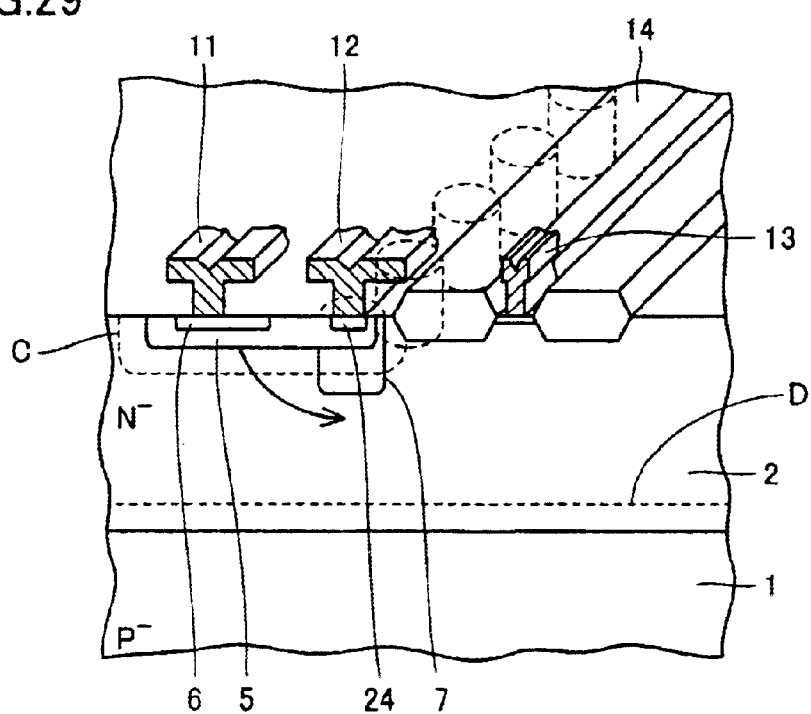

A semiconductor device of an eighth embodiment of the invention will now be described. As shown in FIG. 29, the semiconductor device of this embodiment has the substantially same structure as that of the semiconductor device of the foregoing sixth embodiment shown in FIG. 26 except for that $N^+$-type embedded diffusion region 3 and $N^+$-type diffusion layer 4 are not formed. Accordingly, the same parts and portions bear the same reference numbers, and description thereof is not repeated.

This semiconductor device can achieve the following effect in addition to the effects which are achieved by the semiconductor device of the sixth embodiment already described. Similarly to the semiconductor device of the seventh embodiment already described, the depletion layer (depletion layer C) extends from the interfaces between $N^-$—type epitaxial layer 2 and P-type diffusion regions 5a–5c in the on state. Also, the depletion layer (depletion layer D) extends from the interface between $N^-$-type epitaxial layer 2 and p-type silicon substrate 1 toward $N^-$-type epitaxial layer 2.

This extension of depletion layer D promotes the extension of depletion layer C. Thereby, the electric field at the surface of $N^-$-type epitaxial layer 2 is reduced by the Resurf effect. As a result, the breakdown voltage of the semiconductor device can be further improved.

Since P-type diffusion regions 7 are formed discretely, excessive rising of the JFET resistance is suppressed, and the on resistance of the NPN transistor in the on state can be reduced.

The semiconductor device described above differs from the semiconductor device of the first embodiment only in patterns of the $N^+$-type diffusion region, P-type diffusion region and others, and the method of manufacturing this semiconductor device is basically the same as that of manufacturing the semiconductor device of the first embodiment already described.

Ninth Embodiment

A semiconductor device of a ninth embodiment of the invention will now be described. The semiconductor device has Insulated Gate Bipolar Transistors (which will be referred to as "IGBTs" hereinafter).

Figure 30:
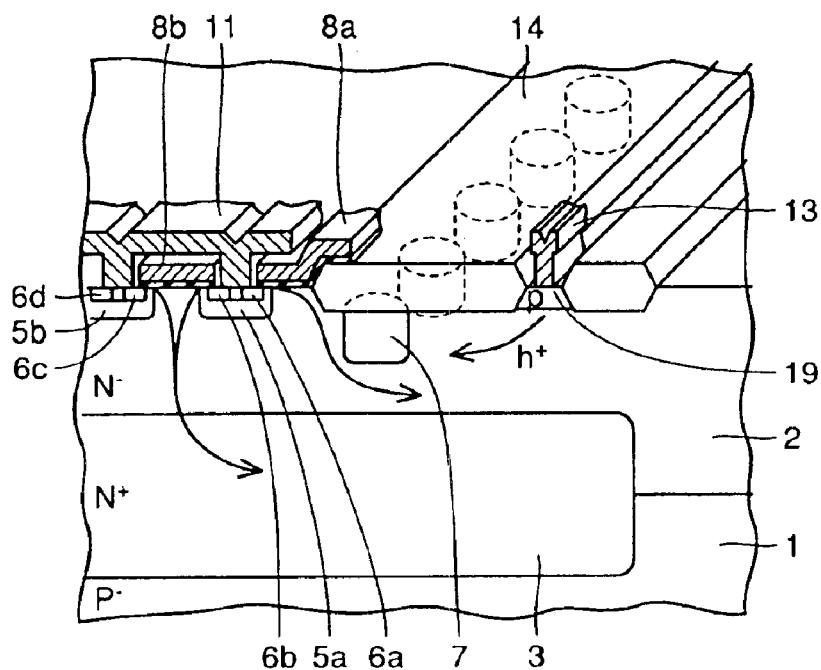
Figure 31:
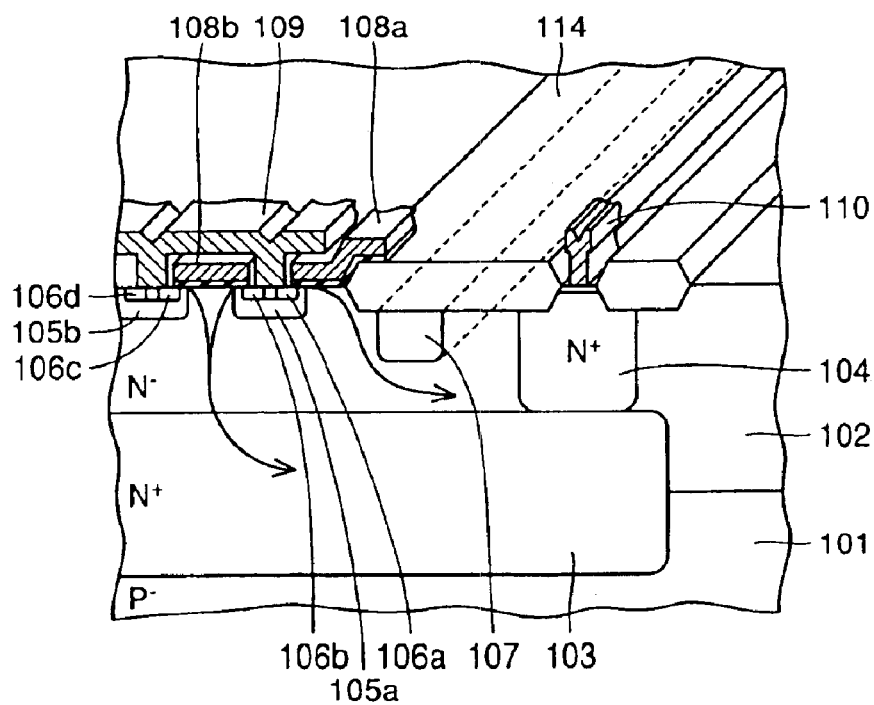
FIG. 31 is a perspective sectional view of a semiconductor device in the prior art.
Figure 32:
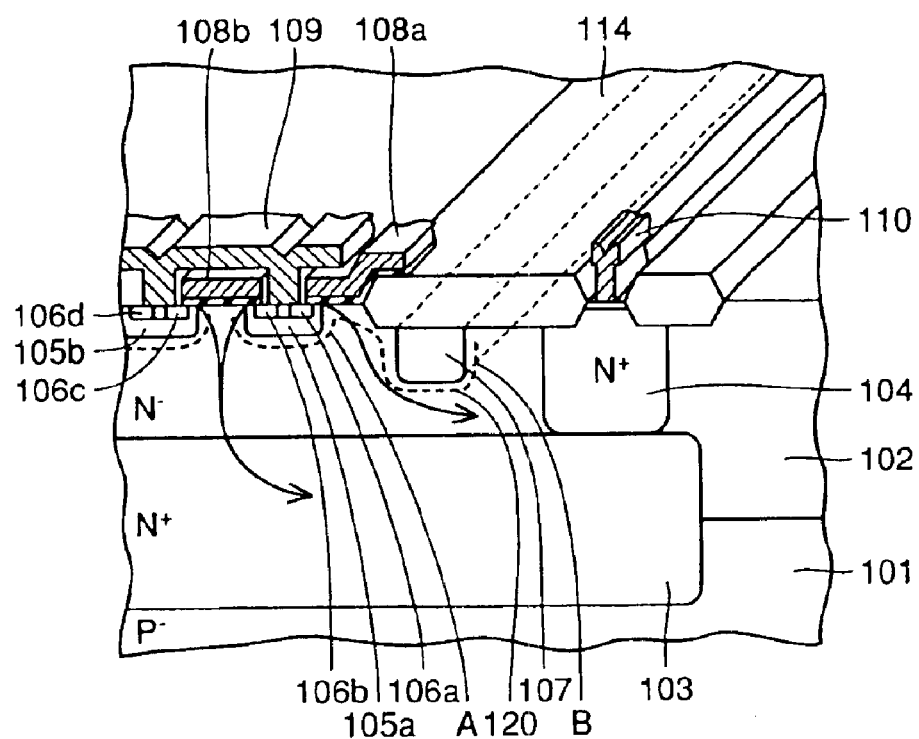
FIG. 32 is a perspective sectional view showing an operation of the semiconductor device shown in FIG. 31.
Figure 33A:
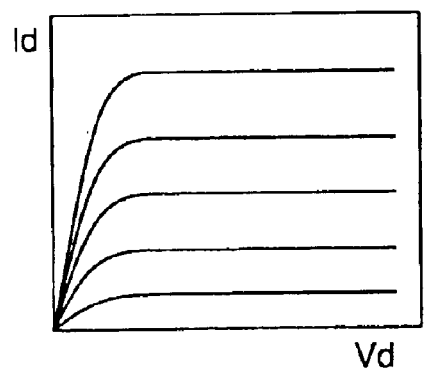
FIGS. 33A and 33B are graphs showing relationships between a drain current and a drain voltage in the conventional semiconductor device.
Figure 33B:
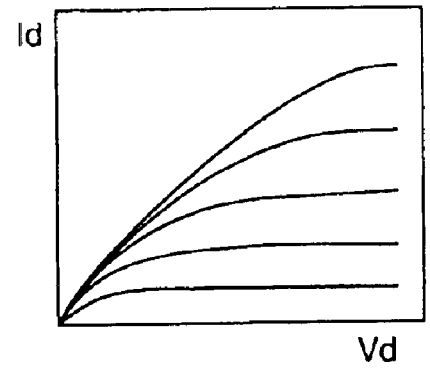

As shown in FIG. 30, $N^+$-type diffusion regions 6a–6d are formed at and near the surface of $N^-$-type epitaxial layer 2. P-type diffusion region 5a surrounding $N^+$-type diffusion regions 6a and 6b is formed at and near the surface of $N^-$-type epitaxial layer 2. P-type diffusion region 5b surrounding $N^+$-type diffusion regions 6c and 6d is formed at and near the surface of N—type epitaxial layer 2.

A $p^+$-type region 19 which is spaced from P-type diffusion region 5a and others is formed at and near the surface of N—type epitaxial layer 2. This $p^+$-type diffusion region 19 forms a collector region, P-type diffusion region 5a and others form an emitter region, and N—type epitaxial layer 2 forms a base region. Collector electrode 13 is electrically connected to $p^+$-type diffusion region 19. Emitter electrode 11 is electrically connected to P-type diffusion region 5a and others.

In this transistor, a base current is supplied through the channel regions formed in P-type diffusion regions 5a and 5b by applying a predetermined voltage to gate electrodes 8a and 8b. The transistor of the above structure is particularly referred to as the "IGBT". Structures other than the above are substantially the same as those of the first embodiment shown in FIG. 1. The same parts and portions bear the same reference numbers, and description thereof is not repeated.

In this semiconductor device, as already described, an electron current flows from $N^+$-type diffusion regions 6a–6d toward N—type epitaxial layer 2 via the channel regions formed in P-type diffusion regions 5a and 5b. Also, holes flow from $p^+$-type region 19 connected to collector electrode 13 toward $N^-$-type epitaxial layer 2.

In this manner, the on state where a current flows between emitter and collector electrodes 11 and 13 is achieved. In this state, the depletion layer extends from the interface between P-type diffusion region 7 and $N^-$-type epitaxial layer 2 toward $N^-$-type epitaxial layer 2.

Since P-type diffusion regions 7 are spaced from each other by a predetermined distance, and therefore are formed discretely, the depletion layers extending from the neighboring P-type diffusion regions are joined together, as already described in connection with the first embodiment shown in FIG. 3. The position of depletion layer end 21, where the depletion layers are joined together, is shallower than the position of the other depletion layer ends.

In the on state, the electron current can flow through portion 22 of $N^-$-type epitaxial layer 2 near a position immediately under depletion layer end 21 so that the operation current of the transistor serving as the PNP transistor increases. Consequently, the on resistance of the IGBT in the on state can be reduced. Further, the effect of reducing the electric field can be kept by the depletion layer which extends from the intermediate between P-type diffusion region 7 and $N^-$-type epitaxial layer 2.

In the third to ninth embodiments described above, P-type diffusion regions 7 are spaced from each other by the predetermined distance, and therefore are formed discretely.

However, similarly to the semiconductor device of the second embodiment shown in FIG. 14, the third to ninth embodiments may employ a P-type diffusion region, which is continuously formed in the direction crossing the direction of the current flow, and has a variable depth. Even in this case, the foregoing effects can likewise be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate of a first conductivity type;
   a first region of a second conductivity type formed on and in direct contact with said semiconductor substrate;
   a second region of the second conductivity type formed at and near the surface of said first region;
   a third region of the first conductivity type formed at and near the surface of said first region, and surrounding said second region;
   a first electrode portion formed on the surface of said third region located between said first and second regions with an insulating film therebetween;
   a second electrode portion connected to said second region;
   a third electrode portion connected to said first region and spaced by a distance from said third region;
   a fourth region of the first conductivity type formed at and near the surface of said first region between said third electrode portion and said third region;
   wherein, a position of an interface between the first region and the fourth region in a depth direction changes for a cross section crossing a region along a direction substantially orthogonal to the direction of the current flow; and
   a fifth region of the second conductivity type formed between the semiconductor substrate of the first conductivity type and the first region of the second conductivity type, the fifth region having an impurity concentration that is higher than the impurity concentration of the first region and extending toward the first region.

2. The semiconductor device according to claim 1, wherein said fourth region is fixed to a constant potential.

3. The semiconductor device according to claim 2, wherein said fourth region is electrically connected to said second electrode portion.

4. The semiconductor device of claim 1, wherein the fourth region is a continuous region having changing depths in a direction crossing a direction of current flow.

5. The semiconductor device according to claim 1, wherein the first region is configured to have a region that is not depleted by a depletion layer extending from the fourth region in an on state.

6. The semiconductor device according to claim 1, wherein the fourth region is spaced apart from the third region.

7. A semiconductor device comprising:
   a semiconductor substrate of a first conductivity type;
   a first region of a second conductivity type formed on and in direct contact with said semiconductor substrate;
   a second region of the second conductivity type formed at and near the surface of said first region;
   a third region of the first conductivity type formed at and near the surface of said first region, and surrounding said second region;
   a first electrode portion formed on the surface of said third region located between said first and second regions with an insulating film therebetween;
   a second electrode portion connected to said second region;
   a third electrode portion spaced by a distance from said third region;
   a fourth region of the first conductivity type formed at and near the surface of said first region between said third electrode portion and said third region; and
   a fifth region of the first conductivity type surrounding said third electrode portion, and formed at and near the surface of said first region,
   wherein said third electrode portion is connected to said fifth region, and
   wherein a position of an interface between said first and fourth regions in a depth direction changes for a cross section crossing the region along a direction substantially orthogonal to the direction of the current flow.

8. A semiconductor device comprising:
   a semiconductor substrate of a first conductivity type;
   a first region of a second conductivity type formed on and in direct contact with said semiconductor substrate;
   a second region of the second conductivity type formed at and near the surface of said first region;
   a third region of the first conductivity type formed at and near the surface of said first region, and surrounding said second region;
   a first electrode portion formed on the surface of said third region located between said first and second regions with an insulating film therebetween;
   a second electrode portion connected to said second region;
   a third electrode portion connected to said first region and spaced by a distance from said third region;
   a fourth region of the first conductivity type formed at and near the surface of said first region between said third electrode portion and said third region;
   wherein,
   the semiconductor device comprises a plurality of said fourth regions; and
   said plurality of fourth regions are spaced from each other by a distance allowing connection between depletion layers extending from neighboring said fourth regions, respectively, in an on state; and
   a fifth region of the second conductivity type formed between the semiconductor substrate of the first conductivity type and the first region of the second conductivity type, the fifth region having an impurity concentration that is higher than the impurity concentration of the first region and extending toward the first region.

9. The semiconductor device according to claim 8, wherein assuming that said first region has an impurity concentration of $N_A$, said fourth region has an impurity concentration of $N_D$, the neighboring fourth regions are spaced by a distance of W, a required breakdown voltage is V, an amount of charges is q, a dielectric constant of the vacuum is $\epsilon$, a relative dielectric constant of silicon is $\epsilon'$, and the impurity concentration NA is sufficiently larger than the impurity concentration ND, and is substantially infinite, the following formulas are satisfied:

$$V > qN_D W^2/(8\epsilon\epsilon')$$

$$W < 2(2V\epsilon\epsilon'/(qN_D))^{(1/2)}.$$

10. The semiconductor device according to claim 8, wherein the fourth region is spaced apart from the third region.

11. A semiconductor device comprising:

a semiconductor substrate of a first conductivity type;

a first region of a second conductivity type formed on and in direct contact with said semiconductor substrate;

a second region of the second conductivity type formed at and near the surface of said first region;

a third region of said first conductivity type formed at and near the surface of said first region, and surrounding said second region;

a first electrode portion connected to said third region;

a second electrode portion connected to said second region;

a third electrode portion spaced from said third region by a distance, and connected to said first region; and a fourth region of the first conductivity type formed at and near the surface of said first region between said third electrode portion and said third region;

said fourth region having a depth changing as a position moves in a direction crossing a direction of flow of the current.

12. The semiconductor device according to claim 11, wherein said fourth region is fixed to a constant potential.

13. The semiconductor device according to claim 12, wherein said fourth region is electrically connected to said first electrode portion.

14. The semiconductor device of claim 11, wherein the fourth region is a continuous region having changing depths in a direction crossing a direction of current flow.

15. A semiconductor device comprising:

a semiconductor substrate of a first conductivity type;

a first region of a second conductivity type formed on and in direct contact with said semiconductor substrate;

a second region of the second conductivity type formed at and near the surface of said first region;

a third region of said first conductivity type formed at and near the surface of said first region, and surrounding said second region;

a first electrode portion connected to said third region;

a second electrode portion connected to said second region;

a third electrode portion spaced from said third region by a distance, and connected to said first region; and a fourth region of the first conductivity type formed at and near the surface of said first region between said third electrode portion and said third region;

said fourth region comprises a plurality of discretely formed regions, and the neighboring fourth regions are spaced from each other by a distance allowing connection between depletion layers extending from the neighboring fourth regions, respectively, in an on state.

16. The semiconductor device according to claim 15, wherein assuming that said first region has an impurity concentration of $N_A$, said fourth region has an impurity concentration of $N_D$, the neighboring fourth regions are spaced by a distance of W, a required breakdown voltage is V, an amount of charges is q, a dielectric constant of the vacuum is $\epsilon$, a relative dielectric constant of silicon is $\epsilon'$, and the impurity concentration $N_A$ is sufficiently larger than the impurity concentration $N_D$, and is substantially infinite, the following formulas are satisfied:

$$V > qN_D W^2/(8\epsilon\epsilon')$$

$$W < 2(2V\epsilon\epsilon'/(qN_D))^{(1/2)}.$$

* * * * *